(12) United States Patent
Murai et al.

(10) Patent No.: US 6,483,227 B2
(45) Date of Patent: Nov. 19, 2002

(54) PIEZOELECTRIC ELEMENT FOR INJECTOR

(75) Inventors: Atsushi Murai; Masayuki Kobayashi, both of Kuwana; Takashi Yamamoto, Chiryu, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/866,876

(22) Filed: May 30, 2001

(65) Prior Publication Data

US 2002/0017832 A1 Feb. 14, 2002

(30) Foreign Application Priority Data

May 31, 2000 (JP) .................................... 2000-163234
Apr. 26, 2001 (JP) .................................... 2000-130168

(51) Int. Cl.⁷ .............................................. H01L 41/08
(52) U.S. Cl. ...................................................... 310/328
(58) Field of Search ................... 310/358, 328, 310/366; H04R 17/00; H04L 41/08

(56) References Cited

U.S. PATENT DOCUMENTS

| | | | |
|---|---|---|---|
| 4,570,098 A | * | 2/1986 | Tomita ........................ 310/328 |
| 4,814,659 A | * | 3/1989 | Sawada ....................... 310/328 |
| 4,909,440 A | * | 3/1990 | Mitsuyasu ................... 310/328 |
| 4,958,101 A | * | 9/1990 | Takahashi ................... 310/328 |
| 5,605,648 A | | 2/1997 | Satou et al. |
| 5,645,753 A | | 7/1997 | Fukuoka et al. |
| 6,230,378 B1 | * | 5/2001 | Cramer ....................... 310/328 |

FOREIGN PATENT DOCUMENTS

| | | |
|---|---|---|
| EP | 921 302 | 6/1999 |
| JP | 8-167746 | 6/1996 |
| JP | 8-183660 | 7/1996 |
| JP | 10-229227 | 8/1998 |
| JP | 11-22993 | 8/1999 |

OTHER PUBLICATIONS

Hellbrand et al., "Large Piezoelectric Monolithic Multilayer Actuators," Actuator 94, 4th International Conference on New Actuators, Conference Proceedings, Jun. 15–17, 1994, 5 pp.

* cited by examiner

Primary Examiner—Nestor Ramirez
Assistant Examiner—Karen B Addison
(74) Attorney, Agent, or Firm—Nixon & Vanderhye P.C.

(57) ABSTRACT

A piezoelectric element, for generating drive force for an injector, is provided with a plurality of alternately stacked piezoelectric layers expanding and contracting in accordance with application of voltage and internal electrode layers for supplying the applied voltage. The piezoelectric layers contain voids, but the total thickness in the stacking direction of the voids contained in any one piezoelectric layer is not more than ⅓ of the thickness in the stacking direction of the piezoelectric layer and the thickness in the stacking direction of each of the voids is not more than 50 μm.

16 Claims, 15 Drawing Sheets

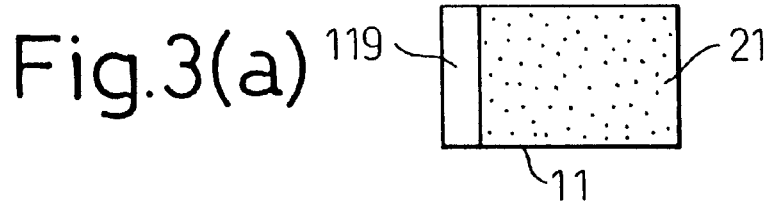
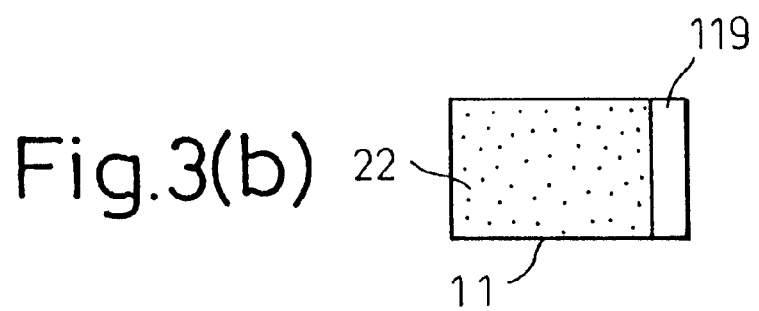
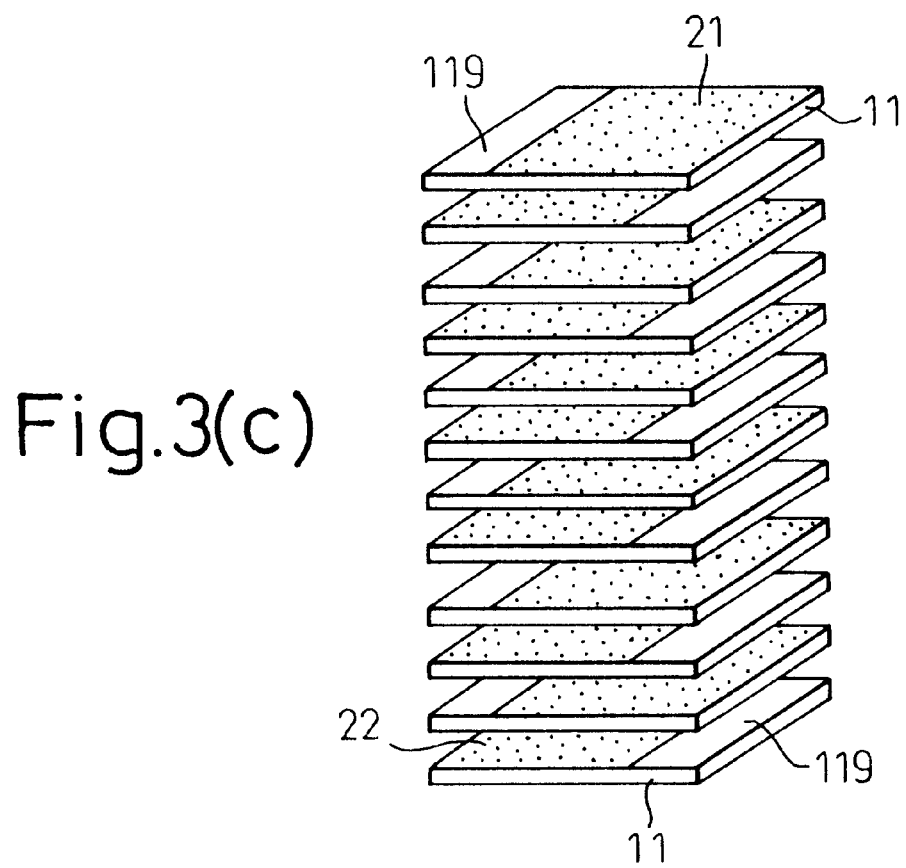

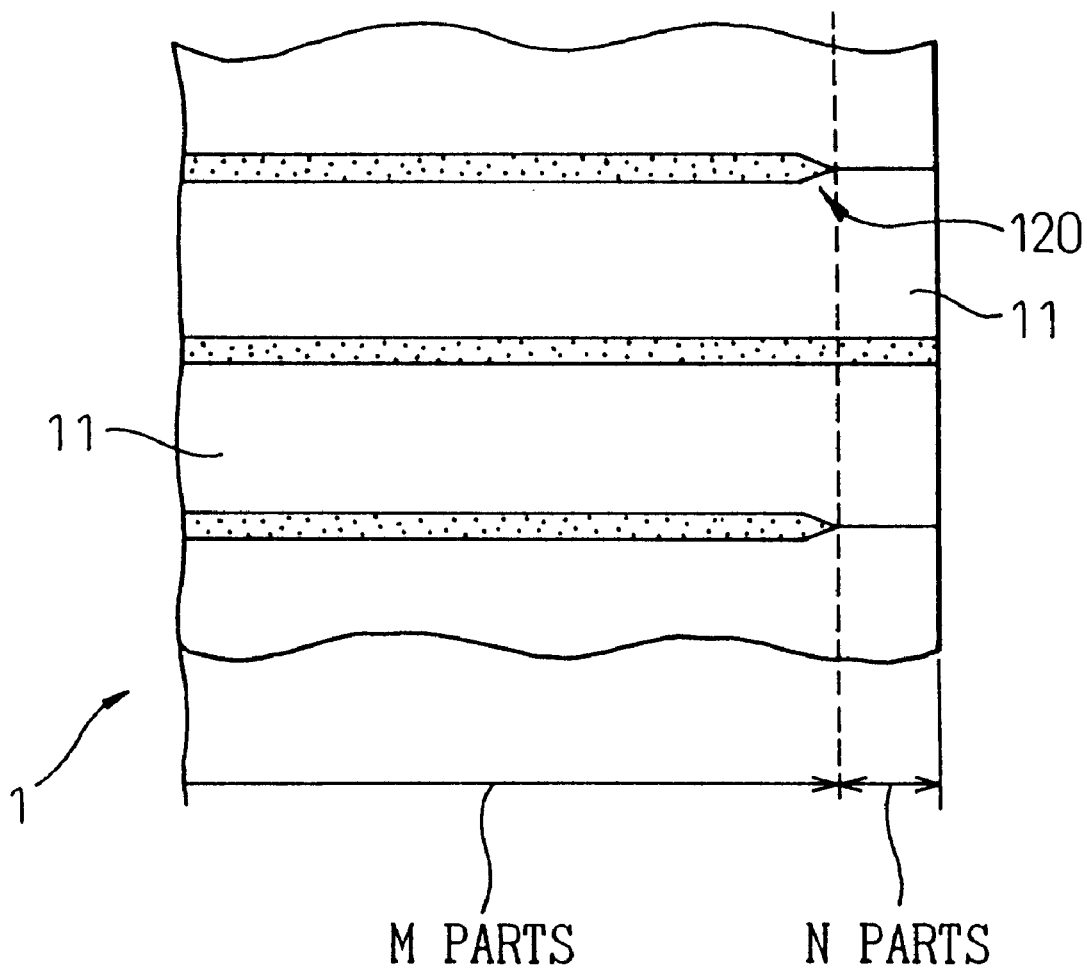

S1

S2

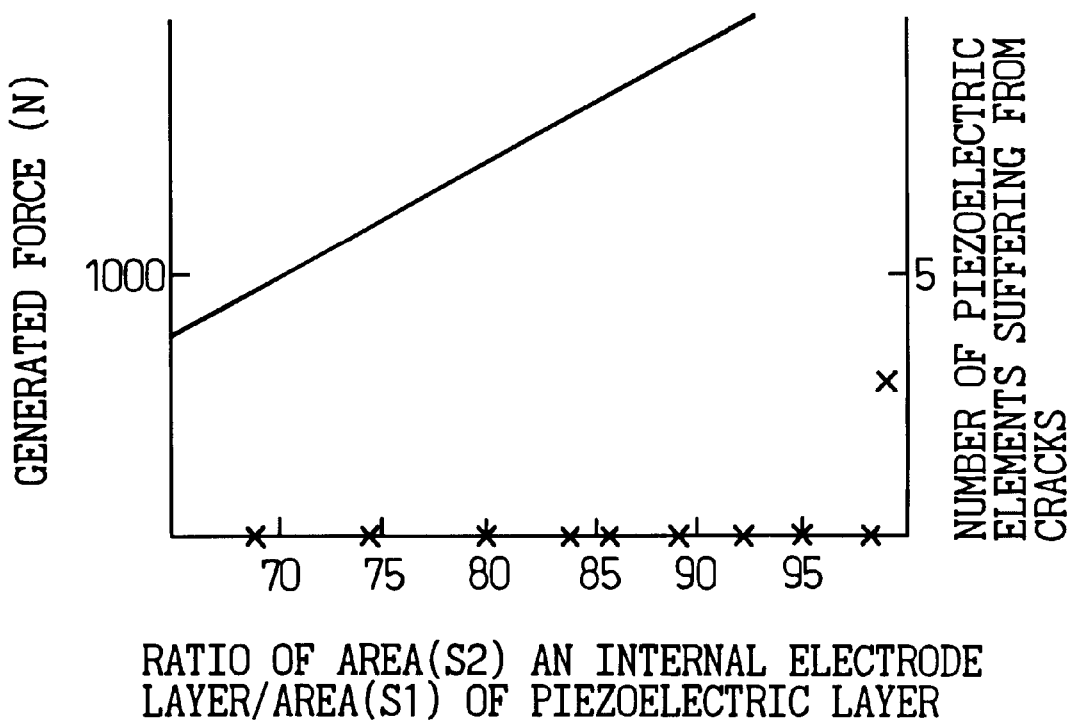

BEFORE DEFORMATION    AFTER DEFORMATION (DRIVE PARTS AND BUFFER PARTS)

BEFORE DEFORMATION    AFTER DEFORMATION (DRIVE PARTS, BUFFER PARTS AND DUMMY PARTS)

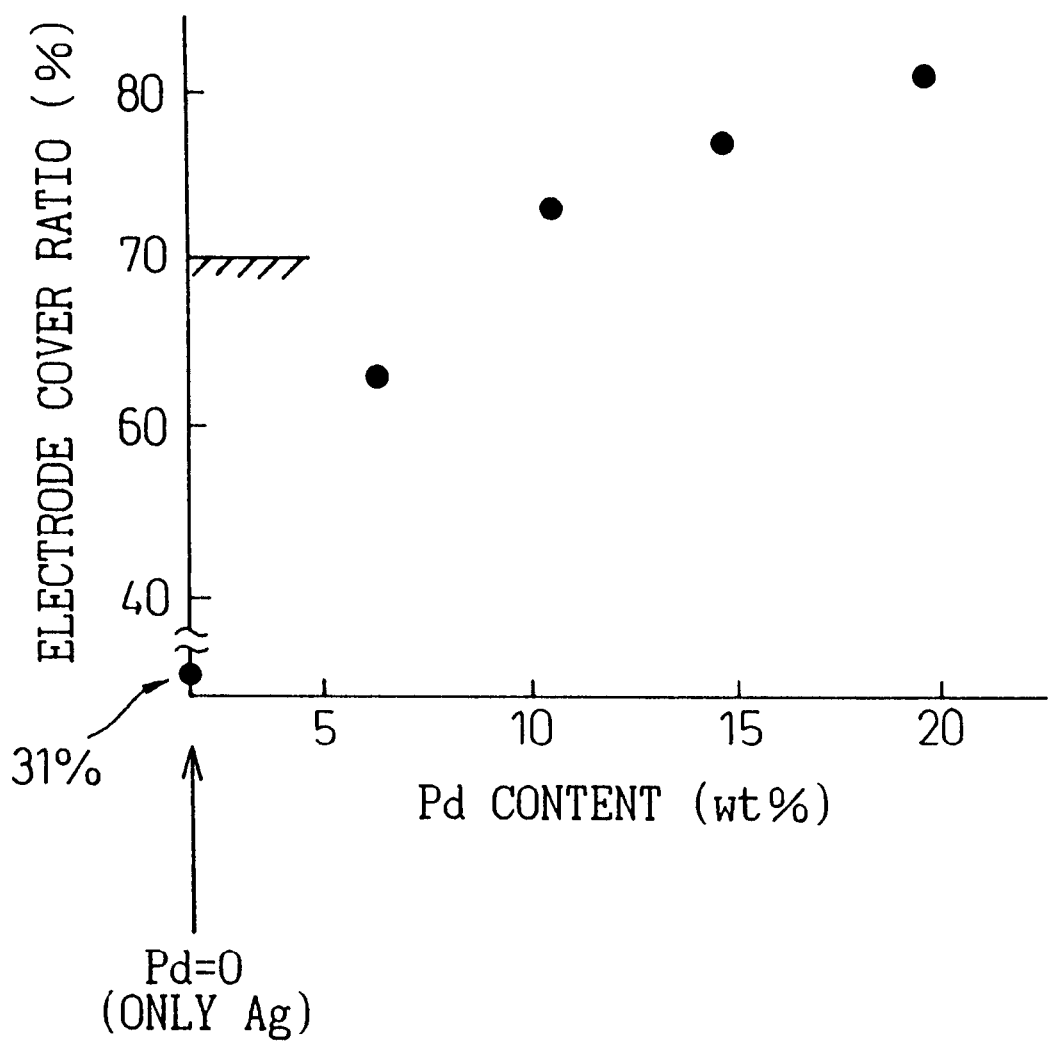

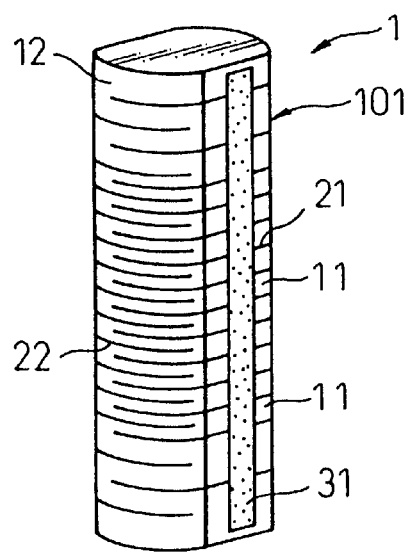
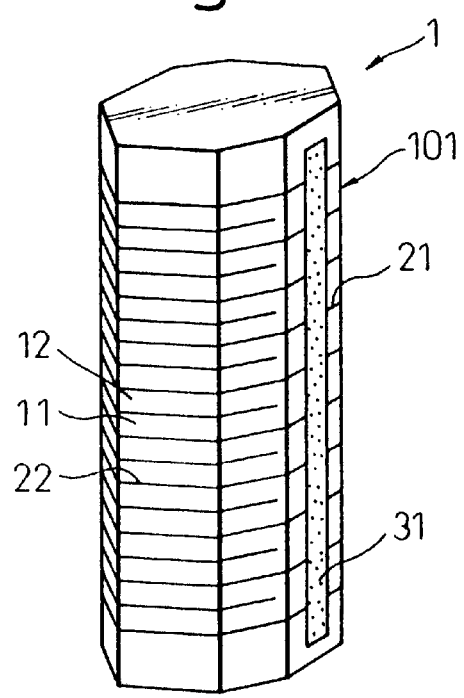

PIEZOELECTRIC ELEMENT FOR INJECTOR

BACKGROUND OF THE INVENTION

1. Field of the Invention

The present invention relates to a stacked type piezoelectric element usable as a source of drive force for an injector.

2. Description of the Related Art

An injector (fuel injection device) of an internal combustion engine of an automobile etc. is designed to inject fuel by operating a valve element of a three-way valve or two-way valve connected to a common rail storing high pressure fuel to switch the opening state of the fuel passages and change the state of pressure imparted to the nozzle needle to open the needle nozzle.

A solenoid valve etc. is generally used as the source of drive force for operating the valve element. Recently, however, attempts have been made to use a stacked type piezoelectric element as the source of drive force, as disclosed in for example Japanese Unexamined Patent Publication (Kokai) No. 11-229993, for the purpose of finer control of the source of drive force and precision control of the state of fuel injection.

While injectors using piezoelectric elements as sources of drive force have been proposed as in Japanese unexamined Patent Publication (Kokai) No. 11-229993, none have yet been commercialized Depending on the type of injector, the injection of a high pressure fuel of for example over 100 MPa is required. Therefore, reliability under a tough environment of use is required in a piezoelectric element for an injector.

When using a conventional piezoelectric element utilized in other fields for an injector of an internal combustion engine of an automobile etc., the piezoelectric element has often not been able to withstand practical use such as, for example, cracking of the piezoelectric element, disconnection in the internal electrode layers, short-circuits due to cracking, etc. in a short time under such a tough environment of use.

Further, for such high pressure fuel injection, a piezoelectric element having an extremely high performance of a displacement of at least 20 $\mu$m and a generated force of at least 1000N is necessary. From this viewpoint as well, it has been difficult to use conventional piezoelectric elements for such injectors.

SUMMARY OF THE INVENTION

An object of the present invention is to provide a piezoelectric element which can optimally be used as a source of drive force for an injector.

According to a first aspect of the present invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; each piezoelectric layer containing voids; a total thickness, in a stacking direction, of voids contained in one piezoelectric layer being not more than ⅓ of a thickness of the piezoelectric layer in the stacking direction; and a thickness of any single void in the stacking direction being not more than 50 $\mu$m.

Preferably, the piezoelectric element can drive the injector at least 2 ×10$^9$ times.

According to a second aspect of the present invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; a thickness of the internal electrode layer being not more than 0.11 times a thickness of the piezoelectric layer.

Preferably, the thickness of the internal electrode layer is not more than 12 $\mu$m.

According to a third aspect of the present invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; a relation of 70%≦S2/S1≦98% standing between an area S1 of a stacking surface of the piezoelectric layer perpendicular to a stacking direction of piezoelectric layers and an area S2 of an internal electrode layer covering the stacking surface.

Preferably, the piezoelectric element is divided in the stacking direction of the piezoelectric layers into a drive part, buffer parts arranged so as to sandwich the drive part, and dummy parts arranged so as to sandwich the buffer parts; the drive part, buffer parts, and dummy parts being configured so that the amounts of expansion and contraction at the time of application of voltage becomes smaller in the order of the drive part, buffer parts, and dummy parts; and a thickness of a piezoelectric layer at the buffer parts being 1.1 to 5.0 times a thickness of a thinnest piezoelectric layer in the drive part.

Preferably, the thickness of a piezoelectric layer in the drive part is not more than 280 $\mu$m.

Preferably, a buffer part includes a plurality of piezoelectric layers.

Preferably, a plurality of drive parts and buffer parts are alternately arranged.

Preferably, a thickness of a piezoelectric layer in a dummy part is not less than 3 times a thickness of a thinnest piezoelectric layer in the drive part.

Preferably, the internal electrode layer is comprised of a material containing Ag and Pd.

Preferably, the internal electrode layer is comprised of a material containing Ag and Pd; and the Ag—Pd containing material contains at least 10 wt % of Pd with respect to the total weight of Ag and Pd.

Preferably, sintered particles comprising the Ag—Pd containing material include at least 80% of particles of a particle size of not more than 10 $\mu$m.

Preferably, each piezoelectric layer is mainly comprised of lead zirconium titanate.

Preferably, each piezoelectric layer contains Mn, the content of Mn being 0.005 to 0.4 wt % with respect to the piezoelectric layer.

Preferably, the lead zirconium titanate basically comprises a Pb(Y$_{0.5}$Nb$_{0.5}$)O$_3$—PbTiO$_3$—PbZrO$_3$—based solid solution; ratios of ingredients in the three-ingredient solid solution are 0.5 mol %<Pb (Y$_{0.5}$Nb$_{0.5}$) O$_3$ ≦3 mol %, 42 mol %<PbTiO$_3$ ≦50 mol %, and 47 mol %<PbZrO$_3$ ≦57.5 mol %; substituent groups of Pb by Sr are present in more than 5 mol % and not more than 15 mol %; a content of Nb$_2$O$_5$ to lead zirconium titanate is not more than 1 wt %; and a content of Mn$_2$O$_3$ to lead zirconium titanate is not less than 0.01 wt % and less than 0.5 wt %.

Preferably, sintered particles comprising the piezoelectric layer have a particle size of not more than 8 μm.

Preferably, the piezoelectric element drives the injector a plurality of times for each combustion stroke of an internal combustion engine.

BRIEF DESCRIPTION OF THE DRAWINGS

These and other objects and features of the present invention will be more apparent from the following description given with reference to the accompanying drawings, wherein:

FIG. 3(a) is a plan view of one piezoelectric layer and internal electrode layer according to the first embodiment of the present invention;

FIG. 3(b) is a plan view of one piezoelectric layer and internal electrode layer according to the first embodiment of the present invention;

FIG. 3(c) is a perspective opened up view of a state of stacking of piezoelectric layers and internal electrode layers according to the first embodiment of the present invention;

FIG. 4 is a schematic view of the state of an end of an internal electrode layer according to the first embodiment of the present invention;

FIG. 11 is a view of the relation among a ratio of (area S2) of internal electrode layer/area (S1) of piezoelectric layer), the number of piezoelectric elements suffering from cracks, and a force generated;

FIG. 14 is a view of the relation between a Pb content of a piezoelectric element and the electrode cover rate according to a ninth embodiment of the present invention;

FIG. 17 is a perspective view of a piezoelectric element of the present invention of a barrel-shaped cross-section; and FIG. 18 is a perspective view of a piezoelectric element of the present invention of a hexagonal-shaped cross-section.

DESCRIPTION OF THE PREFERRED EMBODIMENTS

According to a first aspect of the invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; each piezoelectric layer containing voids; a total thickness, in a stacking direction, of voids contained in one piezoelectric layer being not more than ⅓ of a thickness of the piezoelectric layer in the stacking direction; and a thickness of any single void in the stacking direction being not more than 50 μm.

In the present invention, the total thickness, in the stacking direction, of voids contained in one piezoelectric layer is not more than ⅓ of the thickness of the piezoelectric layer in the stacking direction and the thickness of any single void in the stacking direction is not more than 50 μm.

Figure 1A:
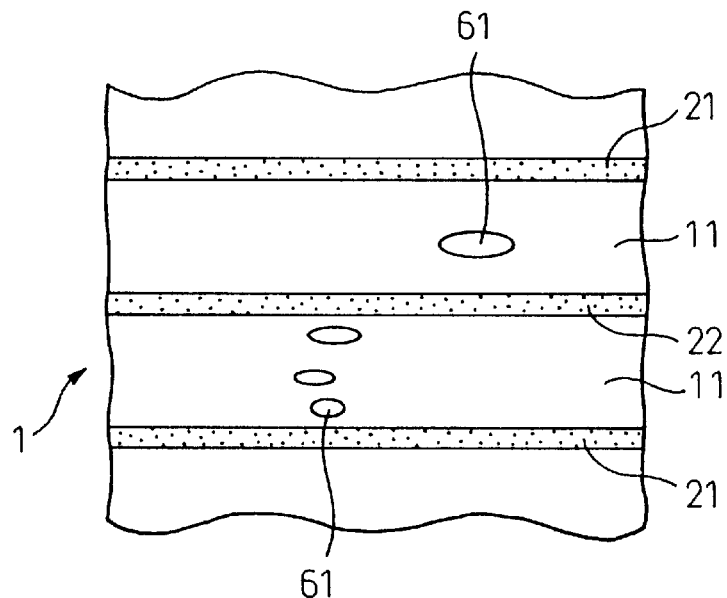
FIG. 1(a) is a schematic view of principal parts of a piezoelectric layer containing voids according to a first embodiment of the present invention.
Figure 1B:
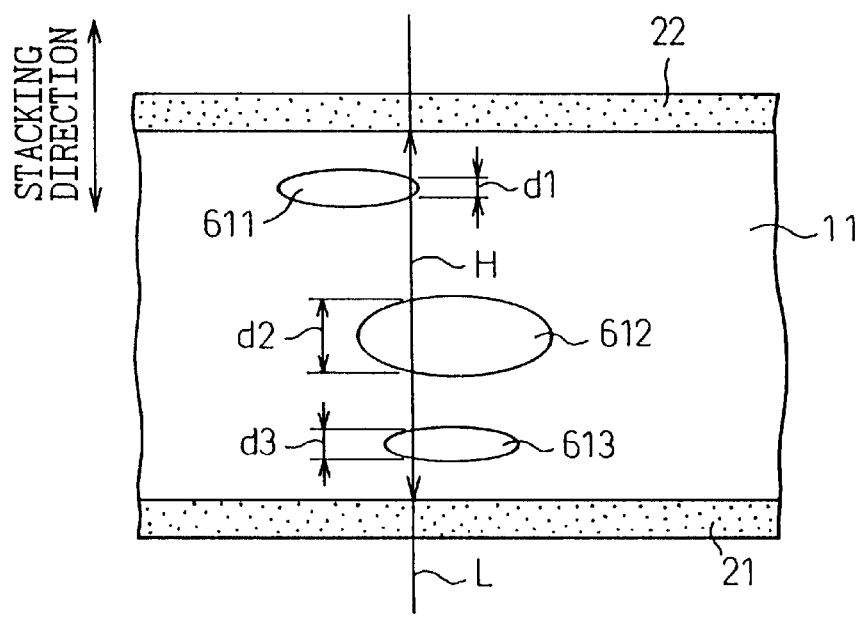
FIG. 1(b) is a schematic view of a total thickness of voids in the stacking direction and the thickness of voids in the stacking direction in the first embodiment of the present invention.

As shown in FIG. 1(b), consider the line L parallel to the stacking direction of the piezoelectric layers 11. The thickness of the piezoelectric layer 11 in the stacking direction on the line L is defined as "H".

At this time, the total of the thicknesses d1 to d2 of the portions of all of the voids 611, 612, and 613 run through by the line L is defined as the total thickness of the voids.

Therefore, in FIG. 1(b), if assuming that d1+d2+d3≦H/3, the above first aspect of the invention is satisfied.

In the piezoelectric element according to the present invention, the above relation is satisfied no matter at what part of the piezoelectric layer 11 the line L is placed.

If the total thickness of the voids in the stacking direction becomes larger than ⅓, dielectric breakdown is liable to occur at the piezoelectric layer when a voltage is applied. Such a piezoelectric element has a low voltage resistance and cannot be used as the source of drive force for an injector.

Further, as shown in FIG. 1(b), if each of the thicknesses d1 to d3 of the portions of the voids 611, 612, and 613 run through by the line L is not more than 50μm, the thickness of any single void in the stacking direction not being more than 50 μm is satisfied.

In the piezoelectric element according to the present invention, this relation is satisfied no matter at what part of the piezoelectric layer 11 the line L is placed.

If the thickness of a void were to exceed 50 μm, there would be a void of a relatively large size with respect to the thickness of the piezoelectric layer, so dielectric breakdown of the piezoelectric layer would be liable to occur. Such a piezoelectric element has a low voltage resistance and cannot be used as a source of drive force for an injector.

Next, the action of the present invention will be explained.

As explained above, a piezoelectric element used as a source of drive force for an injector is required to inject high pressure fuel of for example over 100 Mpa. This requires reliability in a tough, high pressure environment of use.

To inject high pressure fuel of over 100 MPa, a piezoelectric element for an injector is required to exhibit a high performance of for example a displacement of at least 20 μm and a generated force of at least 1000N. Further, piezoelectric layers have tended to become thinner along with the miniaturization of piezoelectric elements, but the electric field intensity given has tended to become a higher, that is, over 1.0 kV/mm.

The piezoelectric layer is comprised of a piezoelectric ceramic sintered body.

The piezoelectric element, as explained later, is produced by preparing a green sheet (forming a piezoelectric layer) from a slurry containing the main ingredients of a piezoelectric material, stacking a suitable number of these to prepare an unsintered stack, and then sintering the stack.

Voids are sometimes formed inside the piezoelectric layer due to the entrainment of air at the time of coating the slurry, the burning off of the binder contained in the slurry after sintering, and other reasons.

A piezoelectric layer having voids is susceptible to dielectric breakdown and short-circuits under the tough environments in which piezoelectric elements for injectors driven a large number of times and exposed to strong electrical fields are used. Along with this, the durability and performance of the piezoelectric element sometimes drops considerably.

When applying voltage to a piezoelectric layer having voids, the voltage is applied to the voids in the same way as the other portions of the piezoelectric layer. Therefore, the voids are polarized to plus and minus states.

When repeatedly driving a piezoelectric element by a high drive frequency of for example an electrical field intensity of over 1.0 kV in a state with a large number or polarized voids present in the stacking direction of the piezoelectric layer, dielectric breakdown occurs at the portions where the piezoelectric layer becomes thinner in the direction of application of voltage and causes short-circuits.

The piezoelectric layer according to the present invention only includes small voids of a size not causing remarkable dielectric breakdown of the piezoelectric layers. That is, the piezoelectric layer according to the present invention has a high insulation at the time of application of voltage and is resistant to the above problem.

Therefore, a piezoelectric element comprised of piezoelectric layers satisfying the above requirement is superior in durability, can be used under a tough environment of use over a long period, and is suitable as a source of drive force for an injector.

According to the present invention, it is therefore possible to provide a piezoelectric element which is optimal for the source of drive force for an injector.

The piezoelectric element can preferably be driven at least $2 \times 10^9$ times.

Due to this, it is possible to obtain a piezoelectric element suitable as a source of drive force for an injector of an internal combustion engine of an automobile The reason why such a piezoelectric element is needed is that an injector mounted in an internal combustion engine of an automobile is sometimes used for multiple injections of as many as five injections for each combustion stroke so as to clean the exhaust gas and improve the fuel efficiency. Further, 400,000 km durability must be guaranteed for the injector.

A piezoelectric element able to provide drive force for such a large number of times enables this stringent requirement to be met.

According to a second aspect of the invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; a thickness of the internal electrode layer being not more than 0.11 times a thickness of the piezoelectric layer.

When the relation between the thicknesses of an internal electrode layer and piezoelectric layer does not satisfy this requirement and is larger than 0.11 times, as explained later, cracks (see FIG. 7) are liable to occur from near the end of the internal electrode layer to the side face of the piezoelectric element.

Note that the above "thicknesses" are the maximum values of the thickness of the piezoelectric layer and the thickness of the internal electrode layer measured in the stacking direction.

According to another aspect of the invention, it is possible to obtain a piezoelectric element having internal electrode layers which are thin relative to the piezoelectric layers.

The internal electrode layers are provided as overlapping parts of the piezoelectric layers as shown in FIG. 4 and the first embodiment.

That is, an internal electrode layer is designed to be exposed at one end at the side face of the piezoelectric element in the direction orthogonal to the stacking direction, but to not be exposed at the other end. For example, the even numbered internal electrode layers counted from the top are connected to the plus electrode of a drive force supply, while the odd numbered internal electrode layers are connected to the minus electrode.

The following phenomenon occurs at the ends of the internal electrode layers not exposed at the side faces.

That is, the portions of the piezoelectric layers contiguous with the plus electrode and the minus electrode internal electrode layers expand and contract with application of voltage, but at the portions not contiguous with the internal electrode layers, in FIG. 4, the portions of the N parts where the piezoelectric layers adjoin each other, the piezoelectric layers do not expand or contract, i.e., do not move.

Therefore, near the ends where the internal electrode layers are not exposed outside of the piezoelectric element, expanding and contracting portions and immobile portions adjoin each other. As a result, strain easily occurs due to the internal stress.

That is, cracks easily occur near the ends as explained later with reference to FIG 7.

By reducing the thickness of the internal electrode layers in this way, it is possible to reduce the strain near the ends of the internal electrode layers not exposed to the outside and possible to prevent the occurrence of cracks derived from the strain.

Therefore, it is possible to improve the durability of the piezoelectric element and possible to use it in a tough environment of use over a long period. This makes it suitable as a source of drive force for an injector driven a large number of times.

According to the above aspect of the present invention, it is possible to provide a piezoelectric element which is optimal for generating the drive force for an injector.

The thickness of the internal electrode layer is preferably not more than 12 $\mu$m.

If the thickness is greater than 12 $\mu$m, as shown in the later explained FIG. 7, cracks are liable to occur near the end of the internal electrode layer.

Note that the above "thickness" is the maximum value of the thickness of the internal electrode layer measured in the stacking direction.

The piezoelectric element has thin internal electrode layers. Therefore, it is possible to improve the durability of the piezoelectric element and possible to use the piezoelectric element in a tough environment of use over a long period. This makes it suitable as a source of drive force for an injector driven a large number of times.

Figure 10A:
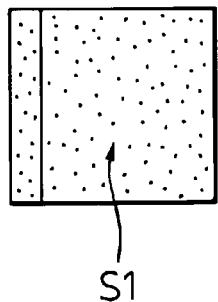
FIG. 10(a) is a view of an area (S1) of a piezoelectric layer according to a fourth embodiment of the present invention.
Figure 10B:
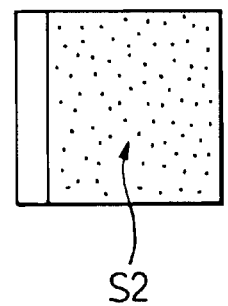
FIG. 10(b) is a view of an area (S2) of an internal electrode layer according to a fourth embodiment of the present invention.

According to a third aspect of the present invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; a relation of $70\% \leq S2/S1 \leq 98\%$ standing between an area S1of a stacking surface of the piezoelectric layer perpendicular to a stacking direction of piezoelectric layers and an area S2of an internal electrode layer covering the stacking surface (see FIGS. 10(a) and 10(b)).

If S2/S1 is less than 70%, the area of a piezoelectric layer to which voltage is applied is reduced, the amount of expansion and contraction is reduced, and therefore the drive force of the piezoelectric element is liable to be reduced. On the other hand, if over 98%, the length of the portions near the ends of the internal electrode layers where the piezoelectric layers adjoin without adjoining with the internal electrode layers becomes shorter, internal stress with a large gradient occurs, and cracks are liable to occur.

It is possible, via the present invention, to reduce the strain near the ends of the internal electrode layers and reduce the occurrence of cracks due to strain.

Therefore, it is possible to improve the durability of the piezoelectric element and possible to use the piezoelectric element in a tough environment of use over a long period. This makes it suitable as a source of drive force for an injector driven a large number of times.

Further, if S2/S1 is in the above range, the area of the internal electrode layers becomes large and voltage can be applied to an area greater than the piezoelectric layers.

Therefore, even if the piezoelectric element has a small cross-sectional area (for example, a sectional area perpendicular to the stacking direction and displacement direction of the piezoelectric element of not more than 80 mm$^2$), it is possible to obtain a generated force of an extremely high 2000N required for fuel injection (preset load) as a source of drive force for an injector.

Note that the "preset load" means the load given from the upper and lower end faces in the stacking direction when driving a piezoelectric element. This is given to prevent overshoot.

As explained above, according to this aspect of the present invention, it is possible to provide a piezoelectric element which is optimal for generating the drive force for an injector.

According to a fourth aspect of the present invention, there is provided a piezoelectric element built into an injector for generating drive force for the injector, comprising a plurality of alternately stacked piezoelectric layers expanding and contracting in accordance with an applied voltage and internal electrode layers for supplying the applied voltage; each piezoelectric layer containing voids; a total thickness, in a stacking direction, of voids contained in one piezoelectric layer being not more than $\frac{1}{3}$ of a thickness of the piezoelectric layer in the stacking direction; a thickness of any single void in the stacking direction being not more than 50 $\mu$m; a thickness of the internal electrode layer being not more than 0.11 times a thickness of the piezoelectric layer; a relation of $70\% \leq S2/S1 \leq 98\%$ standing between an area S1of a stacking surface of the piezoelectric layer perpendicular to a stacking direction of piezoelectric layers and an area S2of an internal electrode layer covering the stacking surface; the piezoelectric element being divided in the stacking direction of the piezoelectric layers into a drive part, buffer parts arranged so as to sandwich the drive part, and dummy parts arranged so as to sandwich the buffer parts; the drive part, buffer parts, and dummy parts being configured so that the amounts of expansion and contraction at the time of application of voltage become smaller in the order of the drive part, buffer parts, and dummy parts; and a thickness of a piezoelectric layer at the buffer parts being 1.1 to 5.0 times a thickness of a thinnest piezoelectric layer in the drive part.

The piezoelectric element comprised of the drive part, buffer parts, and dummy parts becomes hourglass-shaped with bent upper and lower end faces when driven. In order for the piezoelectric element to generate a large force while receiving the preset load, however, the surfaces receiving the preset load have to be flat. Therefore, not driven dummy layers are provided at the upper and lower end faces. If the drive part and the dummy parts are directly connected, however cracks are generated at the interface between them.

Therefore, by arranging dummy parts which cannot move much at all when voltage is applied through buffer parts having less amounts of expansion and contraction than the drive part, the formation of cracks can be prevented.

Further, in a piezoelectric element of one embodiment of the invention since the thickness of the piezoelectric layers in the buffer parts is limited in the above way, it is possible to prevent cracks between the buffer parts and dummy parts and between the buffer parts and drive parts.

If less than 1.1 times, the amount of expansion and contraction of the buffer parts becomes substantially equal to that of the drive part, so cracks are liable to form between the dummy parts and the buffer parts.

If more than 5.0 times, the amount of expansion and contraction of the buffer parts becomes extremely small and becomes equal to that of the dummy layers, so cracks are liable to occur between the buffer parts and the drive part.

The drive part, buffer parts, and dummy parts are designed to become smaller in amounts of expansion and contraction at the time of application of voltage in the order of the drive part, buffer parts, and dummy parts. Specifically, the thickness of the piezoelectric layer between the internal electrode layers is made successively greater and no internal electrode layer is formed at the top face of the upper end dummy part or the bottom face of the bottom end dummy part. Therefore, when using the piezoelectric element as a source of drive force for an injector which is driven a large number of times, cracks do not easily occur and use is possible over a long period.

The thickness of a piezoelectric layer in the drive part is preferably not more than 280 $\mu$m.

Here, consider the amount of deformation of expansion (parallel to displacement direction) and contraction (perpendicular to displacement direction) due to displacement in the case of a small-sized piezoelectric element having a sectional area perpendicular to the stacking direction and displacement direction of the piezoelectric element of not more than 80 mm$^2$ and a length parallel to the displacement direction of not more than 60 mm.

If the lengths in the stacking direction are equal, a piezoelectric element with thick piezoelectric layers has less of a number of stacked layers, while a piezoelectric element with thin piezoelectric layers has more of a number of stacked layers.

When the same displacement occurs in the two piezoelectric elements, the amount of displacement per layer becomes greater in the piezoelectric element with the thick piezoelectric layers.

Therefore, under conditions of an amount of displacement of for example 20 $\mu$m, a startup time (time from application of voltage to piezoelectric element to start of displacement) of a fast 100 $\mu$s, and a drive frequency (speed of expansion and contraction of piezoelectric element) of a fast 200 Hz, the hourglass-shaped deformation becomes greater and cracks easily occur.

Accordingly, by making the thickness of the piezoelectric layers thinner than 280 $\mu$m, it is possible to obtain reliability under tough conditions.

If the thickness of the piezoelectric layers is more than 280 $\mu$m, cracks easily occur and the reliability under tough conditions is liable to fall.

A buffer part preferably includes a plurality of piezoelectric layers.

The greater the number or piezoelectric layers, the better the internal stress can be eased, so by providing a plurality of piezoelectric layers, it is possible to increase the resistance to cracking and obtain a greater effect of prevention of cracks.

Therefore, when using the piezoelectric element for an injector driven a large number of times, it is possible to prevent the occurrence of cracks and use the injector over a long period.

Figure 5A:
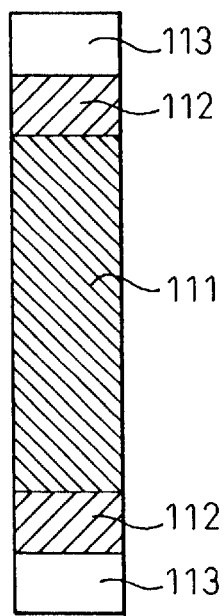
FIG. 5(a) is a sectional view of one piezoelectric element comprised of a drive part, buffer parts, and dummy parts according to the first embodiment of the present invention.
Figure 5B:
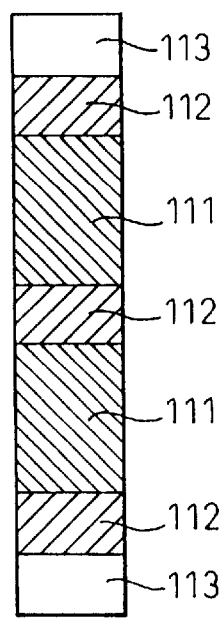
FIG. 5(b) is a sectional view of one piezoelectric element comprised of drive parts, buffer parts, and dummy parts according to the first embodiment of the present invention.
Figure 5C:
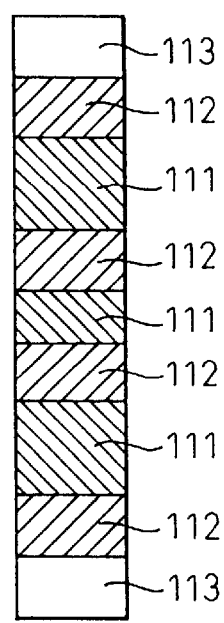
FIG. 5(c) is a sectional view of one piezoelectric element comprised of drive parts, buffer parts, and dummy parts according to the first embodiment of the present invention.

Preferably, a plurality of drive parts and buffer parts are alternately arranged (see FIGS. 5(a), 5(b), and 5(c)).

By arranging a buffer part between the drive part and a dummy part, it is possible to efficiently ease the internal stress.

Further, it is possible to keep down the heat buildup by the arrangement of a buffer part between one drive part and another drive part, so it is possible to obtain a greater effect of prevention of cracks and effect of prevention of a rise of temperature.

In particular, an injector is often placed at the center of an engine where the maximum temperature becomes more than 200° C. Further, the piezoelectric element itself emits heat, so the temperature further rises. By providing a buffer part between drive parts, it is possible to keep down the heat buildup of the piezoelectric element and prevent deterioration of the temperature characteristics.

Therefore, the piezoelectric element according to one exemplary embodiment of the present invention can be used in a tough environment of use over a long period as a source of drive force for an injector driven a large number of times and operating at a high temperature.

A thickness of a piezoelectric layer in a dummy part is preferably not less than 3 times a thickness of a thinnest piezoelectric layer in the drive part.

Due to this, it is possible to apply a uniform preset load to a surface perpendicular to the stacking direction and displacement direction, so it is possible to prevent cracks.

A piezoelectric element used as a source of drive force for an injector is, as described above, driven under tough conditions. For example, it is required to have a displacement of at least 20 $\mu$m and a startup time of 100 $\mu$s etc.

When driven at a drive frequency of for example 200 Hz under the above conditions, it is necessary that no excessive tensile stress be given to non-displacing locations such as the N parts of FIG. 4 and locations desired to be driven.

Since the drive part becomes hourglass shaped when driven, however, if the preset load is applied from the upper and lower ends, the drive part is liable to end up in point contact with the surfaces giving the preset load. In this case, almost no preset load is given to the non-driven parts, that is, the N parts.

Therefore, the piezoelectric element is configured so that a dummy part not deforming due to the drive is provided at the upper and lower ends and so that the preset load is applied by the surfaces there. Due to this, it is possible to apply a sufficient preset load even to non-driven parts such as the N parts and to prevent an excessive tensile stress from being applied.

By making the thickness of a piezoelectric layer of the dummy part at least three times that of a piezoelectric layer of the drive part, it is possible to absorb the deformation of the drive part and the buffer parts and possible to get the preset load transmitted to non-driven parts such as the N parts and give greater resistance to cracks.

Therefore, when using the piezoelectric element as a source of driven force for an injector driven a large number of times, it is possible to prevent the occurrence of cracks and obtain a piezoelectric element able to be used over a long period.

If less than three times, the effect of the deformation of the drive part and the buffer parts will be felt and some deformation will occur in the dummy parts as well. Therefore, cracks may occur and the piezoelectric element may short-circuit.

Further, the preset load may be unevenly applied and cracks may occur in the non-driven parts such as the N parts.

The internal electrode layer is preferably comprised of a material containing Ag and Pd.

By comprising the internal electrode layer of a material including Ag having a low melting point (melting point of 960.05° C.) and Pd having a high melting point (melting point 1555° C.), it is possible to prevent melting of the internal electrode layer and coagulation of the sintered parts and obtain an internal electrode layer having a high coverage rate even if firing the piezoelectric element at the time of production at a high temperature of at least 1000° C.

Therefore, it is possible to apply voltage over a broad area of the piezoelectric layer and to obtain a piezoelectric element giving a large displacement and high generated force as required for an injector even in the case of a piezoelectric element having a small sectional area.

Note that in the material containing Ag and Pd, the Ag or Pd is contained in various states such as Ag compounds or Pd compounds, alloys, or solid solutions.

Preferably, the internal electrode layer is comprised of a material containing Ag and Pd; and the Ag—Pd containing material contains at least 10 wt % of Pd with respect to the total weight of Ag and Pd.

Due to this, it is possible to improve the coverage rate of the internal electrode layer with respect to the piezoelectric layer and obtain a piezoelectric element giving a large displacement and high generated force as required for a source of drive force for an injector.

If the Pd is contained in an amount less than 10 wt %, the internal electrode layers will melt and coagulation will occur at the time of firing in the production of the piezoelectric element and it will become difficult to obtain internal electrode layers having the desired area or coverage rate.

Note that Pd is an expensive metal, so the content is preferably low.

Preferably, the internal electrode layer is comprised of a material containing Ag and Pd; the Ag—Pd containing material contains at least 10 wt % of Pd with respect to the total weight of Ag and Pd; and sintered particles comprising the Ag—Pd containing material include at least 80% of particles of a particle size of not more than 10 $\mu$m.

The piezoelectric element receives the compressive and tensile stress along with its being driven.

When the thickness of the internal electrode layer is less than 12 $\mu$m and sintered particles of a particle size of more than 10 $\mu$m constitute over 80% of the particles of the internal electrode layer as a whole, the rate of filling of the sintered particles in the internal electrode layer is liable to fall In this case, between the sintered particles making up the piezoelectric layers and the sintered particles making up the internal electrode layers, the connection area between the sintered particles making up the internal electrode layers is liable to fall.

In this case, since the bonding strength between the internal electrode layers and the piezoelectric layers falls, the durability of the piezoelectric element also falls. Therefore, when using the piezoelectric element for a source of drive force of an injector driven a large number of times, use over a long period may become impossible.

The method of calculation or the particle size will be explained next.

Figure 16:
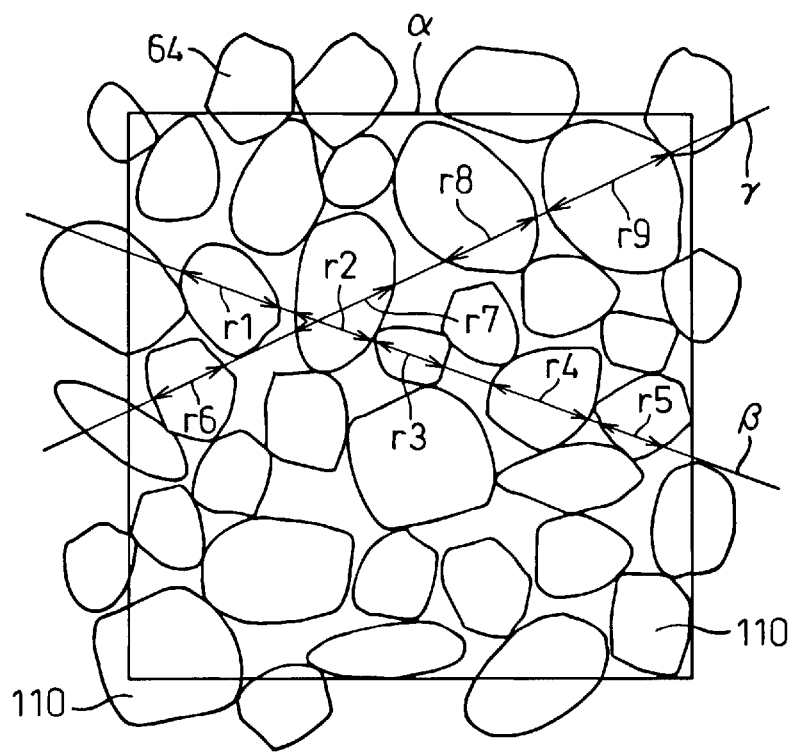
FIG. 16 is a view of the relation between a particle size of the piezoelectric element and amount of displacement according to a 12th embodiment of the present invention.

As shown in FIG. 16, a square $\alpha$ of a suitable size is provided at the surface where the particle size is to be measured and a line $\beta$, line $\gamma$, etc. are provided to pass through one side or the square $\alpha$ to the other side.

Next, as shown in the figure, the portions r1 to r9 etc. of the sintered particles run through by the lines are measured and the averages of r1 to r9 etc. are calculated.

Each piezoelectric layer is preferably mainly comprised of lead zirconium titanate.

Due to this, it is possible to obtain at least the displacement of 20 $\mu$m required for driving an injector even with a small sized piezoelectric element having a sectional area perpendicular to the displacement direction of not more than 80 mm$^3$ and a length parallel to the displacement direction of not more than 60 mm.

Lead zirconium titanate is a solid solution of $PbZrO_3$ and $PbTiO_3$ and is generally called PZT. Further, it sometimes includes various ingredients other than the above such as Ba, Sr, Ca, Hf, Mg, Nb, Mn, Sb, and Co.

Preferably, each piezoelectric element is mainly comprised of lead zirconium titanate; and each piezoelectric layer contains Mn, the content of Mn being 0.005 to 0.4 wt % with respect to the piezoelectric layer.

A piezoelectric element used as a source of drive force for an injector required for accurately injecting an extreme fine amount of fuel has to displace accurately at a high frequency.

If Mn is contained, there are less crystal rotation components at the time of expansion and contraction and it is possible to obtain a piezoelectric element resistant to overshoot and able to accurately displace at a high frequency.

Further, it is possible to obtain a large displacement of more than 20 $\mu$m even in the case of a small sized piezoelectric element having a length parallel to the displacement direction of less than 60 mm etc.

If the content of Mn is less than 0.005 wt %, the crystal rotation components become large and the durability falls, while if more than 0.4 wt %, the displacement of the piezoelectric layers falls, so the amount of expansion and contraction may fall.

Note that Mn is usually contained in the form of various compounds, solid solutions, and alloys.

Preferably, each piezoelectric element is mainly comprised of lead zirconium titanate; each piezoelectric layer contains Mn, the content of Mn being 0.005 to 0.4 wt % with respect to the piezoelectric layer; the lead zirconium titanate basically comprising a $Pb(Y_{0.5}Nb_{0.5})O_3$—$PbTiO_3$—$PbzrO_3$—based solid solution; ratios of ingredients in the three-ingredient solid solution are 0.5 mol %<$Pb(Y_{0.5}Nb_{0.5})O_3 \leq 3$ mol %, 42 mol %<$PbTiO_3 \leq 50$ mol %, and 47 mol %<$PbZrO_3 \leq 57.5$ mol %; substituent groups of Pb by Sr are present in more than 5 mol % and not more than 15 mol %; a content of $Nb_2O_3$ to lead zirconium titanate is not more than 1 wt %; and a content of $Mn_2O_3$ to lead zirconium titanate is not less than 0.01 wt % and less than 0.5 wt %.

By using a material of the above composition, it is possible to obtain a piezoelectric element comprised of piezoelectric layers having dielectric rates not changing much with temperature. Such a piezoelectric element does not fluctuate in output even if used in an environment with large temperature changes.

An injector is generally required to operate normally under an environment of −40 to 150° C. By using a piezoelectric element comprised of such piezoelectric layers, it is possible to obtain an injector which operates normally in the above temperature range.

Sintered particles comprising the piezoelectric layer preferably have a particle size of not more than 8 $\mu$m.

Sintered particles of a large particle size grow at the time of sintering.

The strength of the piezoelectric layer falls if containing sintered particles which have grown. A piezoelectric element used as a source of drive force for an injector must satisfy tough requirements such as a high load (preset load of 500N and generated force of 2000N), a high number of drive shots (at least $2\times10^9$), a high frequency (200 Hz), and a high startup speed (100 $\mu$s). A piezoelectric layer comprised of sintered particles of a particle size of not more than 8 $\mu$m is high in strength and is optimal for a piezoelectric element used under such a tough environment.

When containing sintered particles having a particle size more than 8 $\mu$m, the strength of the piezoelectric layer is low, so when used under tough conditions such as described above, cracks easily occur and the durability is liable to become degraded.

This piezoelectric element for an injector is optimal as a piezoelectric element for an injector which drives the injector a plurality of times for each combustion stroke of an internal combustion engine.

By injecting fuel a plurality of times, the injector for an internal combustion engine reduces the amount of NOx or HC in the exhaust gas.

By using such a piezoelectric element, it is possible to obtain an injector enabling extremely fine control and therefore precise control of the state of fuel injection. Therefore, the above fuel injection can be easily and accurately realized.

First Embodiment

A piezoelectric element 1 for an injector according to a first embodiment of the present invention will be explained next with reference to FIGS. 1(a) to FIG. 6.

Figure 6:
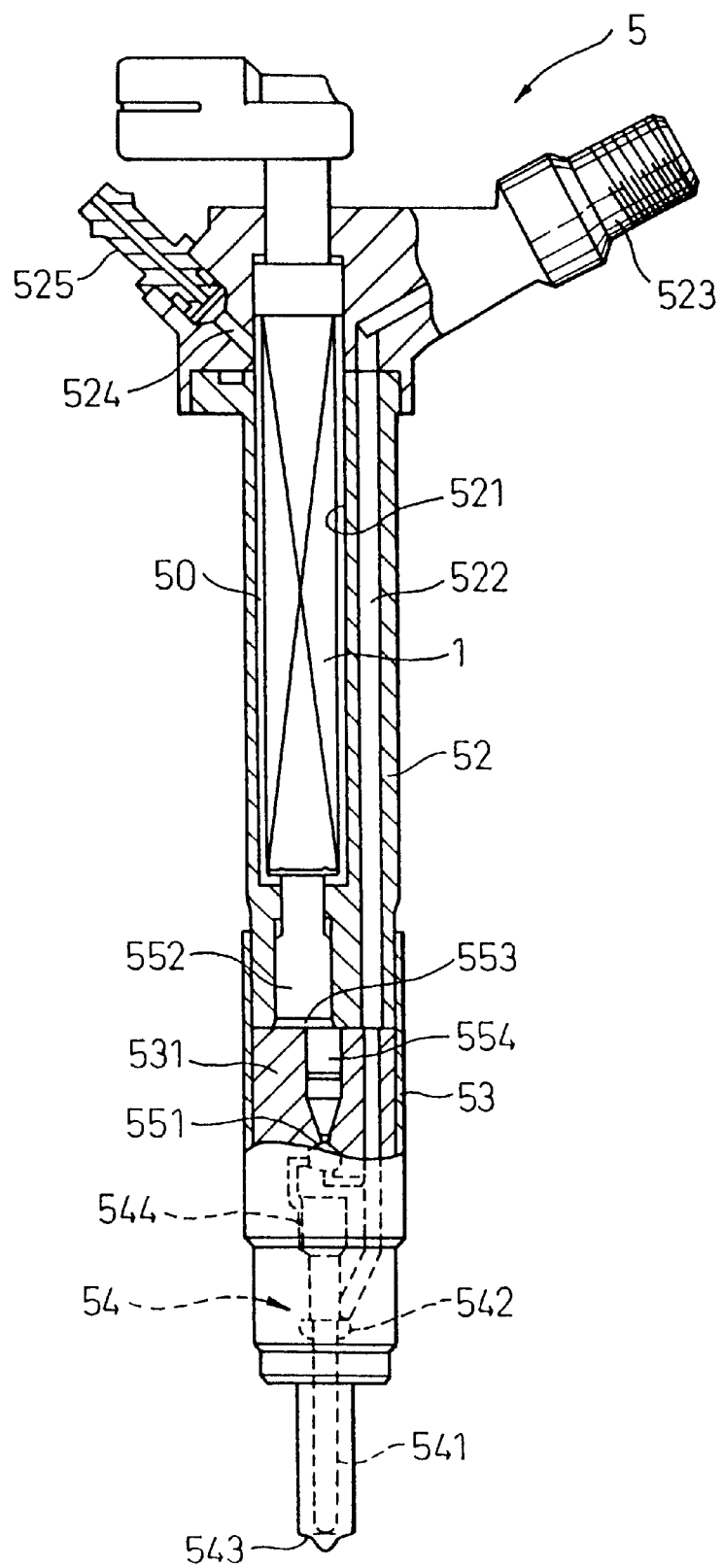
FIG. 6 is a sectional view of an injector according to the first embodiment of the present invention.

The piezoelectric element 1 for an injector of this embodiment, as shown in FIG. 6, is a piezoelectric element built in an injector 5 for generating drive force for the injector 5.

Figure 2A:
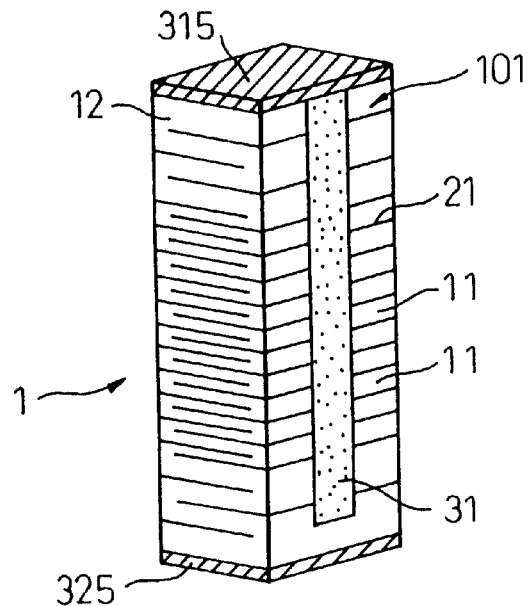
FIG. 2(a) is a perspective view of a piezoelectric element according to the first embodiment of the present invention.
Figure 2B:
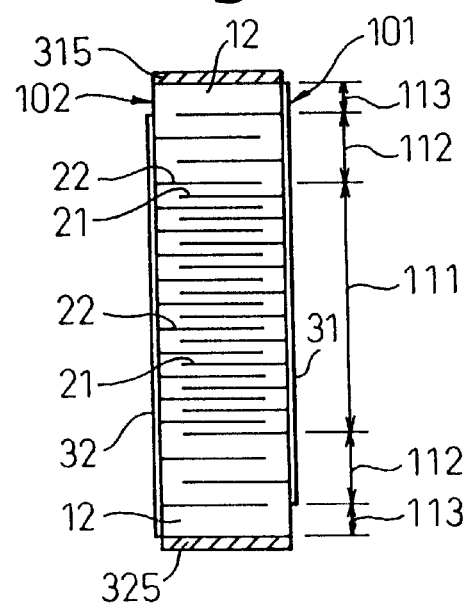
FIG. 2(b) is a sectional view of the piezoelectric element according to the first embodiment of the present invention in the stacking direction.

The piezoelectric element 1, as shown in FIG. 2(a) and FIG. 2(b), is comprised of a plurality of alternately stacked piezoelectric layers 11 expanding and contracting in accordance with an applied voltage and internal electrode layers 21, 22 for supplying the applied voltage.

AS shown in FIG. 1(a), each piezoelectric layer 11 contains voids 61.

The total thickness, in the stacking direction, of the voids 61 contained in one piezoelectric layer 11 is not more than ⅓ of the thickness of the piezoelectric layer 11 in the stacking direction. Further, the thickness of any one void 61 in the stacking direction is not more than 50 $\mu$m.

Details will be explained next.

The piezoelectric element 1, as shown in FIGS. 2(a) and 2(b), is formed by the above piezoelectric layers 11 between which are interposed the above internal electrode layers 21, 22 alternating to the plus and minus sides. As illustrated in the figures, the internal electrode layers 21 are arranged to be exposed at one side face 101, while the other internal electrode layers 22 are arranged to be exposed at the other side face 102. Further, side face electrodes 31 and 32 are formed at the side faces 101, 102 of the piezoelectric element 1 so as to conductively connect the exposed internal electrode layers 21, 22.

Explaining the internal electrode layers 21, 22 in further detail, the ends 120 of the internal electrode layers 21, 22 at the not exposed sides have gradually tapering sectional shapes as illustrated in FIG. 4.

The ends are crushed by hot pressing by a warm water rubber press etc. at the time of producing the piezoelectric element 1, explained later, to be given the final tapered shapes.

Note that when applying voltage from the internal electrode layers 21, 22, the M parts of the piezoelectric layers 11 adjoining the internal electrode layers 21, 22 can expand and contract, but the N parts where only one electrode layer is present cannot expand or contract.

Further, in the piezoelectric element 1, as shown in FIGS. 2(a) and 2(b), the center portion in the stacking direction is defined as the drive part 111, the portions arranged sandwiching this are defined as the buffer parts 112, and the portions sandwiching these buffer parts 112 are defined as the dummy parts 113. The method of production and detailed structure of the piezoelectric element 1 will be explained next.

The piezoelectric element 1 of this embodiment can be produced using the widely used green sheet method. A green sheet is obtained by a known method of weighing powders of the main ingredients of the piezoelectric material, for example, lead oxide, zirconium oxide, titanium oxide, niobium oxide and strontium carbonate, blending them to give a ratio of lead 1 to 2% richer than the stoichiometric ratio of the composition in consideration of the evaporation of lead, dry mixing the blend by a mixer, and then calcining it at 800 to 950° C.

Next, pure water and a dispersant are added to the calcined powder and the mixture wet pulverized by a ball mill. The pulverized result is dried and degreased, then a solvent, binder, plasticizer, dispersant, etc. added and the mixture mixed by a ball mill. Next, the slurry is vacuum deaerated and adjusted in viscosity while stirring by a stirrer.

Next, the slurry is formed into a green sheet of a certain thickness by a doctor blade device.

The obtained green sheet is punched out by a press or cut by a cutter to form rectangles of a predetermined size. These resultant green sheets are used in common for the drive part, buffer parts, and dummy parts.

Next, for example, a paste of silver and palladium comprised of a ratio of silver/palladium of for example 7/3 (hereinafter referred to as an "Ag/Pd paste") is used to form a pattern on one of the surfaces of a shaped green sheet by screen printing. FIGS. 3(a) and 3(b) show examples of a green sheet after printing of the pattern. Note that for convenience or the explanation, parts which are substantially the same are assigned the same reference numerals.

A somewhat smaller pattern 21 (22) is formed on substantially the entire surface of the green sheet 11 for forming the piezoelectric layer by the above Ag/Pd paste so as to form an internal electrode layer 21 (22). A part 119 on which the internal electrode layer 21 (22) is not formed is provided on one of two facing sides of the surface of the green sheet 11. That is, the internal electrode layer 21 (22) does not reach the end of one of the facing sides of the green sheet 11 (portion corresponding to side face 101 or 102 of piezoelectric element 1). The internal electrode layer 21 (22) reaches the other end.

A predetermined number of such green sheets 11 formed with such internal electrode layers 21 (22) are prepared based on the required displacements of the drive part 111 and the buffer parts 112. Further, the required number of green sheets 12 not printed with internal electrode layers are prepared for use for the buffer parts 112 and dummy parts 113.

Next, these green sheets 11 and 12 are stacked together. FIG. 3(c) shows the stacked state of these green sheets 11 and 12, that is, shows the piezoelectric element 1 substantially disassembled. Note that the figure shows mainly the portion relating to the drive part. When stacking the green sheets 11 formed with the internal electrode layers 21 (22), they are stacked so that the parts 119 where the electrodes are not formed are alternately positioned at the left and right of the figure. Due to this, the internal electrode layers 21 reaching and exposed at the side faces 101 of the green sheets 11 at the right side of the figure become the internal electrodes of one polarity, while the internal electrode layers 22 reaching and exposed at the side faces 102 at the left side of the figure become the internal electrodes of the other polarity.

At the center drive part 111, as shown in FIG. 3(c), only the green sheets 11 formed with the internal electrode layers 21 (22) are stacked. At the buffer parts 112, the green sheets 11 are stacked interposed with green sheets 12 not formed with the internal electrode layers. At the dummy parts 113, only the green sheets 12 not formed with internal electrode layers are stacked.

This results in a stack of the structure shown in FIGS. 2(a) and 2(b).

Next, the stack is hot pressed by a warm water rubber press etc., then degreased in an electric furnace at 400 to 700° C. and then fired at 900 to 1200° C.

Next, the above Ag/Pd paste or an Ag paste etc. is coated and fired on the side faces of the stack to form the external electrodes 31 and 32.

The external electrode 31 is formed at the positions where the internal electrode layers 21 of one polarity are exposed and conductively connects the internal electrode layers 21. The other external electrode 32 is formed at the positions where the internal electrode layers 22 of the other polarity are exposed and conductively connects the internal electrode layers 22.

Next, this is immersed in an insulation oil and a direct current voltage is applied between the internal electrode layers 21 and 22 from the external electrodes 31 and 32 to polarize the piezoelectric layers 11 and obtain the piezoelectric element 1.

Note that as explained above, the dummy parts 113 use green sheets (piezoelectric layers) 12 of the same material as the piezoelectric layers 11 used for the drive parts 111 so as to prevent an increase in the types of the manufacturing materials and thereby reduce the manufacturing costs. It is however also possible to form the piezoelectric layers 12 of the dummy parts 113 by different materials. For example, it is also possible to form them by insulating magnetic materials.

Note that in the figures, reference numerals 315 and 325 are insulating plates.

Further, lead lines (not shown) are connected as electrode takeout parts to the external electrodes 31 and 32 of the side faces 101 and 102 of the piezoelectric element 1. Further, insulating films of thicknesses of at least 0.005 mm (not shown) are formed over the entire side faces 101 and 102 orthogonal to the stacking direction of the piezoelectric element 1. In this embodiment, a silicon-based resin is used as the insulating films.

Next, the relation between the state of the voids contained in the piezoelectric layers 11 of the piezoelectric element 1 and the performance of the piezoelectric element 1 is measured by two tests.

A plurality of piezoelectric elements were prepared by the above procedure. The piezoelectric layers of these elements are comprised of PZT of the composition $Pb_{0.91}Sr_{0.09}((Zr_{0.538}Ti_{0.452})(Y_{0.5}Nb_{0.5})_{0.01})O_3$ and $Mn_2O_3$ with a content of Mn in the piezoelectric layers of 0.09 wt %.

The thickness of the piezoelectric layers of the piezoelectric elements used in the tests was 180 $\mu$m. The drive conditions of the piezoelectric element were a preset load of 500N, an electric field intensity of 0 to 1.5 kv/mm, a rectangular input waveform, and a drive frequency of 200 Hz. The number of drive shots was made a maximum of $2 \times 10^9$.

Short-circuits of the piezoelectric elements were checked for by measuring the current flowing through the piezoelectric elements and the electrical resistance of the piezoelectric elements at the time of drive. The tests were stopped when short-circuits occurred.

Ten of each of five types of, that is, a total of 50, piezoelectric elements differing in the ratio of the total thickness in the stacking direction of the voids 61 included in a single piezoelectric layer 11 and the thickness in the stacking direction of the piezoelectric layer 11, that is, taking as an example FIG. 1(b), the value of (d1+d2+d3)/H, were prepared.

The above drive test was run on these elements and the piezoelectric elements short-circuiting before $2 \times 10^2$ drive shots were reached were counted and the results entered into Table 1.

Note that the piezoelectric elements used in the test were deliberately given predetermined amounts of voids by mixing in beads at the time of preparation of the piezoelectric layers.

The "Void/piezoelectric layer" in the table is the ratio (total thickness in stacking direction of voids contained in one piezoelectric layer/thickness in stacking direction of piezoelectric layer). When the value was more than $\frac{1}{3}$ and not more than $\frac{1}{2}$, three short-circuits occurred. Also, from Table 1 it is understood that when the value was more than $\frac{1}{4}$ and not more than $\frac{1}{3}$, when the value was more than $\frac{1}{5}$ and not more than $\frac{1}{4}$, and when the value was more than $\frac{1}{6}$ and not more than $\frac{1}{5}$, short-circuits did not occur.

Further, when the value of voids/piezoelectric layer was $\frac{1}{2}$, short-circuits occurred upon driving $1 \times 10^0$ times at the longest.

It is learned that short-circuits easily occurred when there were a large number of voids compared with the thickness of the piezoelectric layer.

Next, another 80 piezoelectric elements were prepared and driven $2 \times 10^9$ times under the same conditions as above. As a result, 26 of the 80 piezoelectric elements short-circuited.

The short-circuited piezoelectric elements were cut in parallel to the stacking direction of the piezoelectric layers, the thicknesses of the voids were measured, and the total averages of the thicknesses were calculated. The results of the calculation are shown in Table 2.

From Table 2, it is learned that the thickness of voids in the short-circuited piezoelectric elements were all over 50 $\mu$m. The smallest thickness of a void was 54 $\mu$m.

Further, the piezoelectric elements which did not short-circuit were similarly examined, whereupon it was found that the largest thickness of a void was 50 $\mu$m.

Therefore, it was learned that by making the ratio of the (total thickness of the voids)/(thickness of the piezoelectric layers) not more than $\frac{1}{3}$ and by making the thickness of all voids not more than 50 $\mu$m, it is possible to obtain a piezoelectric element superior in durability and resistant to short-circuits during long term continuous drive shots.

Due to this superior durability, it was learned that the piezoelectric element according to this embodiment is optimal for use for an injector.

Next, a brief explanation will be given of an example of an injector which is able to use the piezoelectric element 1 of the above configuration as a source of drive force.

The injector 5, as shown in FIG. 6, is applied to a common rail injection system of a diesel engine.

This injector 5, as shown in the figure, is provided with an upper housing 52 in which the above piezoelectric element 1 is housed as a drive unit and a lower housing 53 affixed to its lower end and in which is formed an injection nozzle unit 54.

The upper housing 52 is substantially cylindrical in shape. The piezoelectric element 1 is inserted into and fixed to it inside a longitudinal bore 52 offset from the center axis.

A high pressure fuel passage 522 is provided in parallel to the side of the longitudinal bore 521. The upper end is communicated with an outside common rail (not shown) through a fuel introduction pipe 523 projecting out above the upper housing 52.

A fuel conduit 525 communicated with a drain passage 524 projects out above the upper housing 52. Fuel flowing out from the fuel conduit 525 is returned to a fuel tank (not shown).

The drain passage 524 is communicated with a later explained three-way valve 551 through a clearance 50 between the longitudinal bore 521 and the drive part (piezoelectric element) 1 and by a passage (not shown) extending from the clearance 50 through the bottom of the inside of the upper and lower housings 52, 53.

The injection nozzle unit 54 is provided with a nozzle needle 541 sliding in the vertical direction inside a piston body 541 and an injection port 543 opened and closed by the nozzle needle 541 and injecting high pressure fuel fed from a fuel reservoir 542 to each cylinder of the engine. The fuel reservoir 542 is provided around the middle of the nozzle needle 541. The bottom end of the high pressure fuel passage opens there. The nozzle needle 541 receives the fuel pressure in the valve opening direction from the fuel reservoir 542 and receives the fuel pressure in the valve closing direction from a back pressure chamber 544 provided facing the upper end face. When the pressure of the back pressure chamber 544 falls, the nozzle needle 541 is lifted, the injection port 543 is opened, and the fuel is injected.

The pressure of the back pressure chamber 544 is regulated by the three-way valve 551. The three-way valve 551 is configured so as to selectively communicate the back pressure chamber 544 and the high pressure fuel passage 522 or drain passage 524. Here, it has a ball-shaped valve element which opens and closes a port communicating with the high pressure fuel passage 522 or the drain passage 524. This valve element is driven by the above drive unit through a large diameter piston 552, an oil pressure chamber 553, and a small diameter piston 554 arranged below it.

Next, an explanation will be given of the action and effects of this embodiment.

A piezoelectric layer with voids becomes a cause of short-circuits of the piezoelectric element under the tough environment of use as a source of drive force for an injector.

As explained above, a piezoelectric element used as a source of drive force of an injector is required to have reliability under a tough environment of use since the injector is required to inject high pressure fuel of over 100 MPa for example.

A piezoelectric element for an injector is required to exhibit a high performance of for example an amount of displacement of at least 20 μm and a generated force of at least 1000N. Further, the piezoelectric layers have tended to become thinner recently along with the increasingly smaller size of piezoelectric elements, while the intensity of the imparted electrical field has become over a high 1.0 kV/mm.

A piezoelectric layer having voids easily experiences dielectric breakdown and short-circuits under the tough environment of use of a piezoelectric element for an injector driven a large number of times and exposed To a high electrical field intensity. Along with this, the durability and performance of the piezoelectric element sometimes fall considerably.

When applying a voltage to a piezoelectric layer having voids, if the piezoelectric element is repeatedly driven by a high drive frequency of for example an electrical field intensity of over 1.0 kV/mm in the state with a large number of polarized voids present in the stacking direction of the piezoelectric layer, dielectric breakdown occurs at the portion where the piezoelectric layer becomes thinner in the direction of application of voltage and becomes a cause of short-circuits.

The piezoelectric layer according to this embodiment only includes small voids. That is, the piezoelectric layer according to the present embodiment has a high insulation property at the time of application of voltage and therefore is resistant to the above problem.

According to the present embodiment, it was learned that a piezoelectric element Which has a piezoelectric layer with a total thickness of the voids contained in the piezoelectric layer of not more than ⅓ of the thickness of the piezoelectric layer and with a thickness of all voids of not more than 50 μm is superior in durability, can be used in a tough environment of use over a long period, and is suitable as a source of drive force of an injector.

In summary, according to the present embodiment, it is possible to provide a piezoelectric element which is optimal for the source of drive force of an injector.

Note that the piezoelectric element 1 of the present embodiment, as shown in FIG. 5(a), is comprised of a drive part 111, buffer parts 112, and dummy parts 113.

As another example, as shown in FIG. 5(b), a buffer part 112 is provided at the center in the stacking direction, drive parts 111 are provided at its two sides, other buffer parts 112 are further provided at the two sides of the drive parts 111, and dummy parts 113 are provided at the two sides of the same.

Due to this, it is possible to ease the heat buildup at the center of the piezoelectric element.

Further, as shown in FIG. 5(c), it is possible to provide a drive part 111 at the center in the stacking direction, provide buffer parts 112 at its two sides, provide drive parts 111 at the two sides of the same, and further provide buffer parts 112 and dummy parts 113 at the two sides of the drive parts 111.

Due to this, it is possible to further ease the stress and heat buildup compared with the piezoelectric element shown in FIG. 5(b).

TABLE 1

| Voids/piezoelectric layers | No. of shots generated |
| --- | --- |
| ½ | 3 |
| ⅓ | 0 |
| ¼ | 0 |
| ⅕ | 0 |
| ⅙ | 0 |

TABLE 2

| No. | Void thickness (μm) |
| --- | --- |
| 1 | 62 |
| 2 | 73 |
| 3 | 75 |

TABLE 2-continued

| No. | Void thickness ($\mu$m) |
|---|---|
| 4 | 54 |
| 5 | 81 |
| 6 | 58 |
| 7 | 74 |
| 8 | 73 |
| 9 | 68 |
| 10 | 70 |
| 11 | 55 |
| 12 | 72 |
| 13 | 69 |
| 14 | 55 |
| 15 | 60 |
| 16 | 71 |
| 17 | 61 |
| 18 | 77 |
| 19 | 59 |
| 20 | 80 |
| 21 | 57 |
| 22 | 78 |
| 23 | 67 |
| 24 | 62 |
| 25 | 77 |
| 26 | 66 |

Second Embodiment

Figure 7:
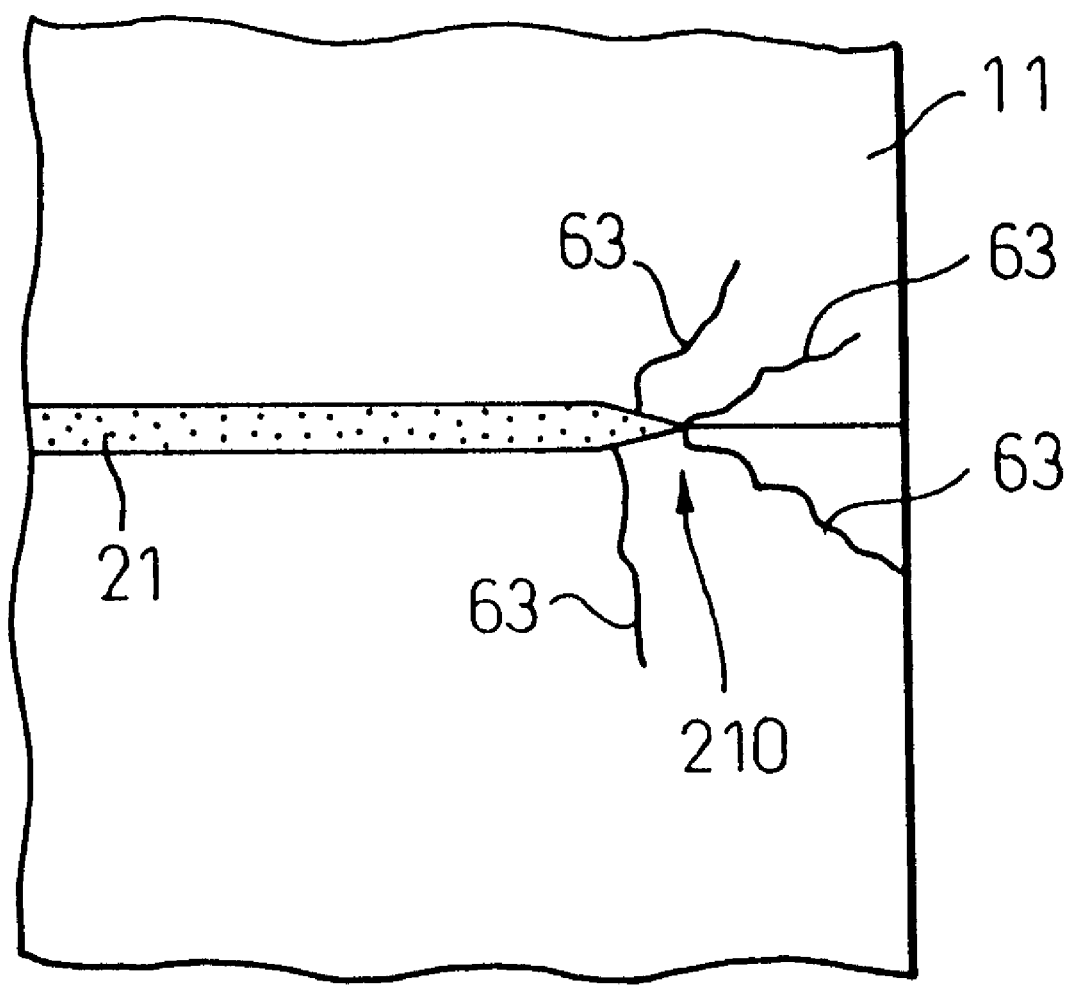
FIG. 7 is a sectional view of cracks occurring from an end of an internal electrode layer to a side face of a piezoelectric element according to a second embodiment of the present invention.
Figure 8:
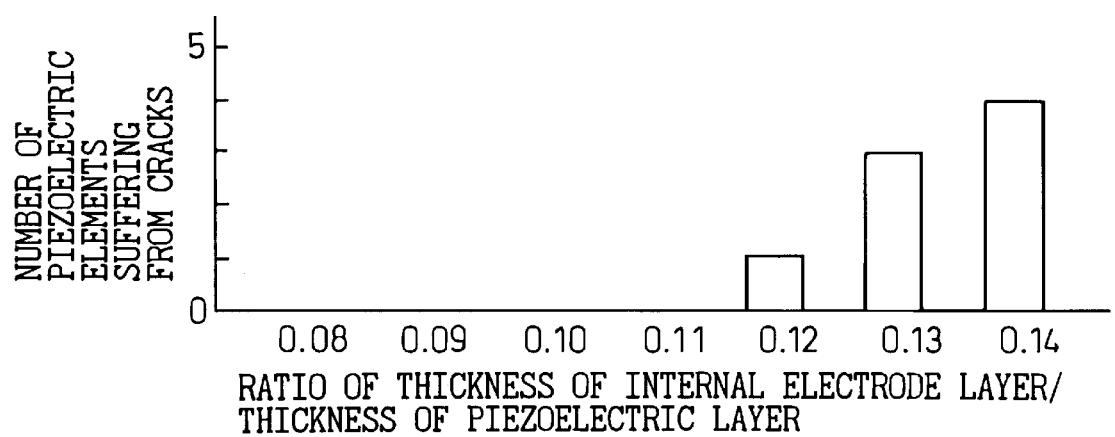
FIG. 8 is a view of the relation between a ratio of (thickness of internal electrode layers/thickness of piezoelectric layers) and the number of piezoelectric elements suffering from cracks.

In this embodiment, as shown in FIG. 7 and FIG. 8, the ratio between the thickness of the internal electrode layers and the thickness of the piezoelectric layers and the state of occurrence of cracking were measured.

Five piezoelectric elements each of seven types differing in ratio of the thickness of the internal electrode layers and the thickness of the piezoelectric layers as shown in FIG. 8, or a total of 35, were prepared by the same method as in the first embodiment.

These piezoelectric elements were driven $2 \times 10^9$ times under the same drive conditions as the first embodiment. Next, the number of piezoelectric elements which cracked were counted. The results are shown together in FIG. 8.

Note that the cracks 63 occurring during the driving in the present embodiment occurred mostly near the ends 210 of the internal electrode layers 21 as shown in FIG. 7.

As can be appreciated from the figure, no cracks 63 occur as shown in FIG. 7 if the ratio of (thickness of internal electrode layers/thickness of piezoelectric layers) is not more than 0.11.

By making the internal electrode layers thin relative to the piezoelectric layers in this way, it is possible to reduce the strain near the ends of the internal electrode layers and possible to prevent the occurrence of cracks due to strain.

Therefore, by making the (thickness of internal electrode layers/thickness of piezoelectric layers) not more than 0.11, it is possible to obtain a piezoelectric element having a high durability, able to be used in a tough environment of use over a long period, and optimal for generating the drive force for an injector.

Third Embodiment

Figure 9:
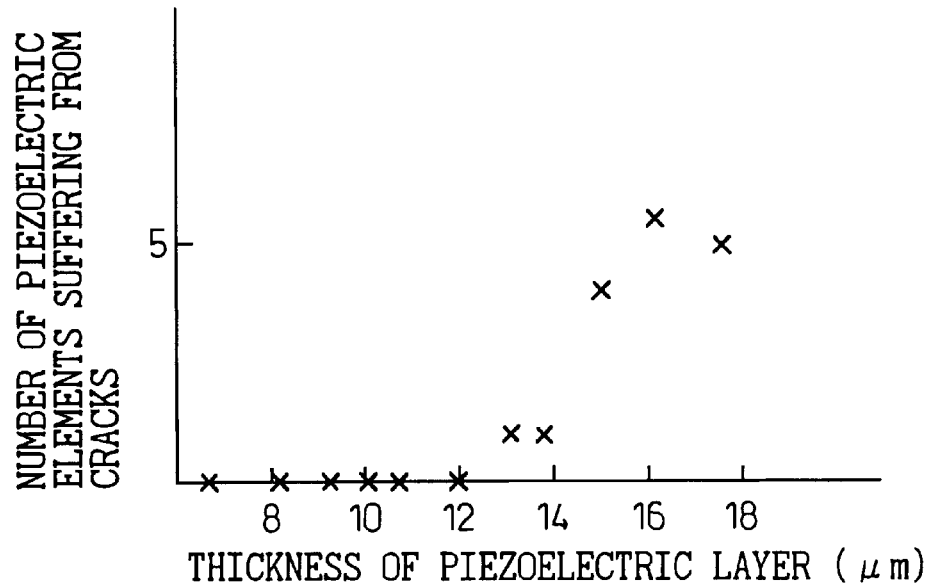
FIG. 9 is a view of the relation between a thickness of the internal electrode layers and the number of piezoelectric elements suffering from cracks.

In this embodiment, as shown in FIG. 9, the thickness of the internal electrode layers and the state of occurrence of cracks were measured.

Five piezoelectric elements each of 11 types differing in the thickness of the internal electrode layers as shown in FIG. 9, or a total of 55, were prepared by the same method as in the first embodiment.

These piezoelectric elements were driven $2 \times 10^9$ times under the same drive conditions as the first embodiment. Next, the number of piezoelectric elements which cracked were counted. The results are shown together in FIG. 9.

Note that the cracks 63 occurring during the driving in the present embodiment occurred mostly near the ends 210 of the internal electrode layers 21 as shown in FIG. 7.

As can be seen from the figure, no cracks occur if the thickness of the internal electrode layers is not more than 12 $\mu$m.

By making the internal electrode layers 21 thin in this way, it is possible to reduce the strain near the ends 210 of the internal electrode layers 21 and possible to prevent the occurrence of cracks due to strain.

Therefore, by making the internal electrode layers thin, it is possible to obtain a piezoelectric element having a high durability, able to be used in a tough environment of use over a long period, and optimal for generating the drive force for an injector.

Fourth Embodiment

In this embodiment, the relation among to what extent the stacking surfaces of the piezoelectric layers adjoining internal electrode layers are covered by the internal electrode layers, the ratio of area (S2/S2) of the internal electrode layers and the piezoelectric layers, the generated force of the piezoelectric elements, and the number of cracks occurring are measured. Note that FIGS. 10(a) and 10(b) show detailed examples of S1 and S2.

Five piezoelectric elements each of 10 types of different ratios of area S2/S1 as shown in FIG. 11, or a total of 50, were prepared by the same method as in the first embodiment. Note that the sectional area of the piezoelectric layers of the piezoelectric elements prepared in this embodiment was made 75 mm$^2$.

These piezoelectric elements were driven $2 \times 10^9$ times under the same drive conditions as the first embodiment. Next, the number of piezoelectric elements which cracked were counted. The results are shown together in FIG. 11.

Note that the cracks 63 occurring during the driving in the present embodiment occurred mostly near the ends 210 of the internal electrode layers 21 as shown in FIG. 7.

Further, the generated force obtained by the above drive operations was measured for the piezoelectric elements of the different ratios of areas. The results are shown together in FIG. 11.

From FIG. 11, it is learned that the closer the ratio of areas to 100%, the higher the generated force. Some of the piezoelectric elements having ratios of area higher than 98% were observed to crack.

In this way, it was learned that to obtain the 1000N required for use for generating the drive force of an injector by the piezoelectric element of the present embodiment, the ratio of areas has to be at least 70%.

Further, from the state of occurrence of cracks, it was learned that cracks do not occur if the ratio of areas is not more than 98%.

Therefore, it was learned that for a small sized piezoelectric element having an area of the piezoelectric layers of 75 mm$^2$, by making the ratio of areas 70% to 98%, it is possible to obtain a piezoelectric element having a higher generated force, high in durability, able to be used in a tough environment of use over a long period, and optimal for generating the drive force of an injector.

Fifth Embodiment

In this embodiment, the relation between the thickness of the piezoelectric layers of the different parts and the occurrence of cracks was measured for piezoelectric elements comprised of a drive part, buffer parts, and dummy parts as shown in FIG. 5(a).

Ten piezoelectric elements each were prepared for the different ratios of thickness by the same method as the first embodiment. That is, if designating the thickness of the piezoelectric layer of the drive part as "1"; three piezoelectric elements each were prepared for a thickness of the piezoelectric layers of the dummy parts of 2.5 to 3.2 and for a thickness of the piezoelectric layers of the dummy parts of 1 to 5.2.

The detailed combinations are shown in Table 3.

These piezoelectric elements were driven $2 \times 10^9$ times under the same drive conditions as the first embodiment. Next, the number of cracks occurring between the layers were counted.

Note that the cracks 63 occurring during the driving in the present embodiment occurred mostly near the ends 210 of the internal electrode layers 21 as shown in FIG. 7.

In Table 3, "POOR" indicates piezoelectric elements where even one sample suffered from cracking, while "GOOD" indicates piezoelectric elements where none of the three samples experienced cracking.

According to Table 3, it is learned that by making the thickness of the piezoelectric layers of the buffer parts 1.1 to 5 times the thickness of the piezoelectric layers of the drive part and by making the thickness of the piezoelectric layers of the dummy parts at least 3 times the thickness of the piezoelectric layers of the drive part, a piezoelectric element which does not crack can be obtained.

Such a piezoelectric element can be used under a tough environment of use over a long period and is optimal for generating drive force for an injector.

In Table 4, in the "Presence of cracks", "POOR" indicates piezoelectric elements where even one sample suffered from cracking, while "GOOD" indicates piezoelectric elements where none of the three samples experienced cracking.

The "Occurrence of cracks" shows the number of piezoelectric elements which experienced cracking.

From this table, it was learned that by making the thickness of the piezoelectric layer not more than 280 μm, it is possible to obtain a piezoelectric element which does not crack.

Next, the action and effects of this embodiment will be explained.

Figure 12A:
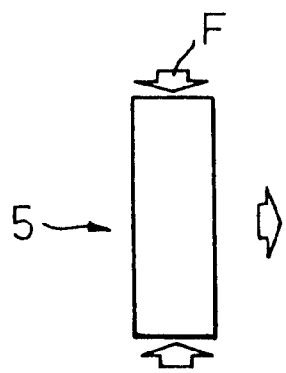
FIG. 12(a) is a view of the state of drive when a preset load is applied to the piezoelectric element during driving according to a sixth embodiment of the present invention.

As shown in FIG. 12(a), a preset load is applied to the piezoelectric element 5 in the stacking direction as shown by the arrow line F at the time of a drive operation.

Figure 12B:
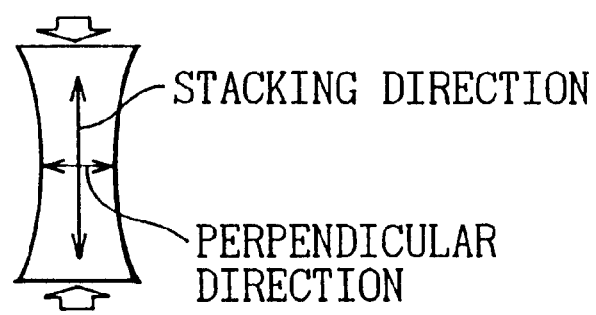
FIG. 12(b) is a view of the state of drive when a preset load is applied to the piezoelectric element during driving and the piezoelectric element expands in the stacking direction and contracts in a perpendicular direction according to the sixth embodiment of the present invention.

Further, as shown in FIG. 12(b), elongation occurs in the stacking direction and contraction occurs in the direction perpendicular to the stacking direction. As a result, the piezoelectric element deforms into an hourglass shape.

Figure 12C:
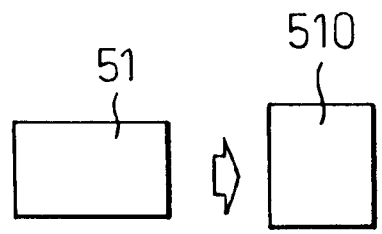
FIG. 12(c) is a view of the state of deformation of a thick piezoelectric layer when a preset load is applied to a thick piezoelectric element according to the sixth embodiment of the present invention.
Figure 12D:
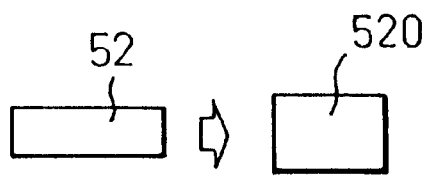
FIG. 12(d) is a view of the state of deformation of a thin piezoelectric layer when a preset load is applied to a thick piezoelectric element according to the sixth embodiment of the present invention.

If the length in the stacking direction of the piezoelectric element 5 is the same, however, the number of stacked layers of a piezoelectric element comprised of thick piezoelectric layers as shown in FIG. 12(c) becomes smaller, while the number of stacked layers of a piezoelectric element comprised of thin piezoelectric layers as shown in FIG. 12(d) becomes greater.

When the same displacement occurs in the two, a large elongation such as shown by reference numeral 510 occurs

TABLE 3

| Buffer part | Dummy part | | | | | | | |
|---|---|---|---|---|---|---|---|---|
| | 2.5 | 2.6 | 2.7 | 2.8 | 2.9 | 3.0 | 3.1 | 3.2 |
| 1.0 | — | — | — | — | — | POOR | POOR | POOR |
| 1.1 | — | — | — | POOR | POOR | GOOD | GOOD | GOOD |
| 1.2 | — | — | POOR | POOR | POOR | GOOD | GOOD | GOOD |
| 1.3 | POOR | POOR | POOR | POOR | POOR | GOOD | GOOD | — |
| . | . | . | . | . | . | . | . | . |
| . | . | . | . | . | . | . | . | . |
| 4.8 | POOR | POOR | POOR | POOR | POOR | GOOD | GOOD | — |
| 4.9 | — | — | — | POOR | POOR | GOOD | GOOD | — |
| 5.0 | — | — | — | POOR | POOR | GOOD | GOOD | GOOD |
| 5.1 | — | — | — | — | POOR | POOR | POOR | POOR |
| 5.2 | — | — | — | — | — | POOR | POOR | — |

Sixth Embodiment

In this embodiment, the relation between the thickness of the piezoelectric layers at the drive part and the occurrence of cracks in a piezoelectric element comprised of a drive part, buffer parts, and dummy parts as shown in FIG. 5(a) was measured.

Three piezoelectric elements each of different thicknesses of the piezoelectric layers were prepared by the same method as in the first embodiment. Note that the specific thicknesses are given in Table 4.

Note that the piezoelectric elements of this embodiment were small sized elements having a sectional area perpendicular to the displacement direction of 75 mm² and a length parallel to the displacement direction of 60 mm.

These piezoelectric elements were driven $2 \times 10^9$ times under the same drive conditions as the first embodiment. Next, the number of cracks occurring between the layers were counted.

Note that the cracks 63 occurring during the driving in the present embodiment occurred mostly near the ends 210 of the internal electrode layers 21 as shown in FIG. 7.

at the thick piezoelectric layer 51 as shown in FIG. 12(c), while a small elongation such as shown by reference numeral 520 occurs at the thin piezoelectric layer 52 as shown in FIG. 12(d). That is, the deformation per layer becomes greater in the case of a piezoelectric element comprised of thick piezoelectric layers.

Therefore, in a piezoelectric element having an amount of displacement of 20 μm, a startup time of a fast 100 μs, and a drive frequency of a high 200 Hz, since the hourglass shaped deformation is large and occurs fast, cracks such as shown In FIG. 7 easily occur.

Accordingly, as learned from Table 4, by making the thickness of the piezoelectric layers not more than 280 μm, it is possible to obtain a piezoelectric element resistant to cracking even under the tough conditions of use required for an injector.

TABLE 4

| Thickness of piezoelectric layer | Presence of cracks | Occurrence of cracks |
| --- | --- | --- |
| 250 | GOOD | 0 |
| 260 | GOOD | 0 |
| 270 | GOOD | 0 |
| 280 | GOOD | 0 |
| 290 | POOR | 2 |
| 300 | POOR | 3 |

Seventh Embodiment

In this embodiment, the relation between the number of buffer parts sandwiched between the drive parts and the rise in temperature of the piezoelectric element for a piezoelectric element comprised of drive parts, buffer parts, and dummy parts as shown in FIG. 5(c) will be explained.

Piezoelectric elements were prepared as samples by the same method as the first embodiment. The number of buffer parts sandwiched between the drive parts was different. Note that zero such buffer parts means the piezoelectric element as shown in FIG. 5(a).

These piezoelectric elements were driven $2 \times 10^9$ times under the same drive conditions as the first embodiment. They were driven continuously for 10 hours, then measured for the temperature. How many degrees the temperature rose from before the drive operation is shown in Table 5.

As will be understood from the table, the greater the number of buffer parts, the more the rise of temperature was suppressed.

Therefore, it is learned from this embodiment that by increasing the number of buffer parts, it is possible to obtain a piezoelectric element which can be used under a tough environment of use over a long period as a piezoelectric element for an injector driven a large number of times and operating at a high temperature.

TABLE 5

| No. of buffer parts sandwiched between drive parts | Rise in temperature (° C.) |
| --- | --- |
| 0 | 118 |
| 1 | 103 |
| 2 | 94 |
| 3 | 90 |

Eighth Embodiment

In this embodiment, the relation between the ratio of the (thickness of the piezoelectric layers of the dummy parts)/(thickness of the piezoelectric layers of the drive part) and the occurrence of cracks for a piezoelectric element comprised of a drive part, buffer parts, and dummy parts as shown in FIG. 5(a) will be explained based on Table 3 obtained in the fifth embodiment.

Short-circuits occurred in piezoelectric elements having a ratio of the (thickness of the piezoelectric layers of the dummy parts)/(thickness of the piezoelectric layers of the drive part) of not more than 2.7. Further, it was learned that cracks occurred in piezoelectric elements having ratios of 2.8 and 2.9.

However, it was learned that no cracks or short-circuits occurred in piezoelectric elements of ratios over 3.0.

Figure 13A:
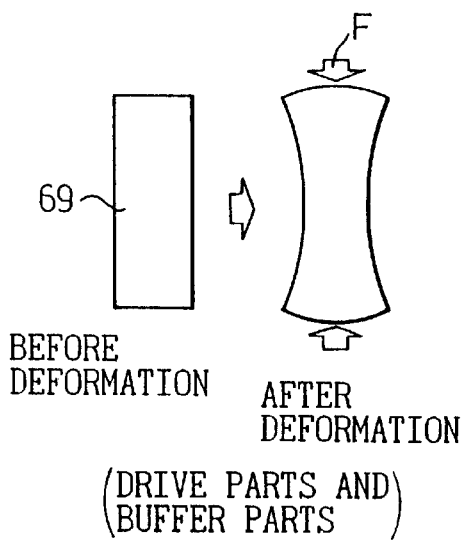
FIG. 13(a) is a view of the shape of a piezoelectric element comprised of only drive parts and buffer parts according to an eighth embodiment of the present invention before and after deformation.
Figure 13B:
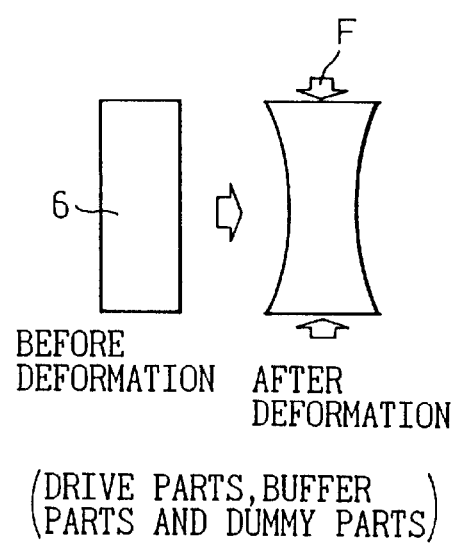
FIG. 13(b) is a view of the shape of a piezoelectric element comprised of drive parts, buffer parts, and dummy parts according to an eighth embodiment of the present invention before and after deformation.

Consider, however, the piezoelectric element 69 comprised of only drive parts and buffer parts as shown in FIG. 13(a) and the piezoelectric element 6 comprised of drive parts, buffer parts, and dummy parts as shown in FIG. 13(b).

The piezoelectric element 69, as shown by the arrow line F, elongates in the stacking direction and contracts in the perpendicular direction to deform to an hourglass shape shown in that figure upon being driven while given a preset load In FIG 13(b), due to the provision of dummy parts, the piezoelectric element deforms in the state with the upper and lower end faces kept flat as shown in the figure.

A piezoelectric element used as a source of drive force for an injector is driven under tough conditions as explained above. For example, it is required to have an amount of displacement of at least 20 μm and a startup time of 100 μs.

When driven under such conditions by a drive frequency of for example 200 Hz, it is necessary that no excessive tensile stress be given to locations which do not displace such as the N parts of FIG. 4 and locations desired to be driven.

Since the drive part becomes hourglass shaped when driven, however, if the preset load is applied from the upper and lower ends, the drive part is liable to end up in point contact with the surfaces giving the preset load. In this case, almost no preset load is given to the non-driven parts, that is, the N parts.

Therefore, the piezoelectric element is configured so that a dummy part not deforming due to the drive is provided at the upper and lower ends and so that the preset load is applied by the surfaces there. Due to this, it is possible to apply a sufficient preset load even to non-driven parts such as the N parts and to prevent an excessive tensile stress from being applied.

By making the thickness of a piezoelectric layer of the dummy part at least three times that of a piezoelectric layer of the drive part, it is possible to absorb the deformation of the drive part and the buffer parts and possible to get the preset load transmitted to non-driven parts such as the N parts and give greater resistance to cracks.

Therefore, it is possible to obtain a piezoelectric element which can prevent cracks and can be used over a long period of time when using the piezoelectric element as a source of drive force for an injector driven a large number of times.

Ninth Embodiment

In this embodiment, the relation between the content of Pd when comprising the internal electrode layers by Ag—Pd containing materials and the electrode coverage rate was measured.

Four types of piezoelectric elements differing in content of Pd in the internal electrode layers were prepared by the same method as in the first embodiment. Note that the piezoelectric elements of this embodiment were small sized elements having a sectional area perpendicular to the displacement direction of 75 mm$^2$ and a length parallel to the displacement direction of 60 mm.

Further, piezoelectric elements of internal electrode layers comprised only of Ag were prepared by the same method as in the first embodiment.

The electrode coverage rates of these piezoelectric elements were measured by slicing the piezoelectric elements and observing them under an electron microscope, whereupon, as shown in FIG. 14, it was found that the coverage rate when making the internal electrode layers out of only Ag was low and that the greater the content of Pd, the higher the coverage rate obtained.

In particular, to obtain a high generated force of over 2000N, it is preferable to give an electrode coverage rate of at least 70%. In this case, it was learned that the content of Pd is preferably at least 10 wt %.

10th Embodiment

In this embodiment, the internal electrode layers were comprised of Ag and Pd and the relation between the state of the particle size of the sintered particles comprising them and the occurrence of cracks was measured.

Three piezoelectric elements each of six types differing in particle size, that is, a total of 18, were prepared by the same method as in the first embodiment considering the particle growth due to firing.

Note that the particle size was measured after the firing. The method of measurement was as described in detail in the 12 embodiment explained later.

Further, the sectional area in the stacking direction of the piezoelectric layers of the thus prepared piezoelectric elements was made 75 mm$^2$.

These piezoelectric elements were driven $2 \times 10^9$ times under the same drive conditions as the first embodiment. Next, the piezoelectric elements which cracked were counted. The results are shown all together in Table 6.

As a result of the above measurement, it was learned that no cracks occurred in samples with particle sizes of not more than 9.8 μm, but cracks occurred (in two out of three samples) in samples with a particle size of 11.2 μm. In this way, it was learned that piezoelectric elements having particle sizes of sintered particles in the internal electrode layers of not more than 10 μm can be used in tough environments of use over long periods and are optimal for generating drive force for injectors.

TABLE 6

| Particle size (μm) | Presence of cracks |
| --- | --- |
| 3.1 | GOOD |
| 5.0 | GOOD |
| 6.7 | GOOD |
| 8.3 | GOOD |
| 9.8 | GOOD |
| 11.2 | POOR |

11th Embodiment

In this embodiment, the amount of Mn contained in the piezoelectric layer, the amount of displacement of the piezoelectric element, and the durability were measured.

Piezoelectric elements were prepared as samples by the same method as in the first embodiment except at that time the composition of the piezoelectric layers was suitably changed.

The piezoelectric layer of each sample was comprised of PZT of the composition $Pb_{0.91}Sr_{0.09}((Zr_{0.538}Ti_{0.452})(Y_{0.5}Nb_{0.5})_{0.01})O_3$ and $Mn_2O_3$.

Four piezoelectric elements each of compositions including Mn in the piezoelectric layers in amounts of 0 (that is, only the PZT), 0.005 wt %, 0.01 wt %, and 0.015 wt % that is, a total of 16 piezoelectric elements, were prepared in the same way as in the first embodiment.

These were driven $2 \times 10^9$ times under the same drive conditions as in the first embodiment. Next, they were examined for short-circuits and number of cracks. The results are shown in Table 7.

Note that the cracks 63 occurring during the driving in the present embodiment occurred mostly near the ends 210 of the internal electrode layers 21 as shown in FIG. 7.

The piezoelectric elements comprised of piezoelectric layers containing at least 0.005 wt % of Mn neither short-circuited nor cracked, but the piezoelectric elements comprised of piezoelectric layers not containing Mn short-circuited and cracked.

Further, piezoelectric elements were prepared as samples in the same way as in the first embodiment except for changing the composition of the piezoelectric layers.

The piezoelectric layers of the samples were comprised of PZT and $Mn_sO_j$ in the same way as above.

Further, piezoelectric elements different in content of Mn with respect to the piezoelectric layers were prepared in the same way as in the first embodiment.

The piezoelectric elements were driven in the same way as in the first embodiment and the amounts of displacement were measured by a laser interferometer. The results are shown in FIG. 15.

Figure 15:
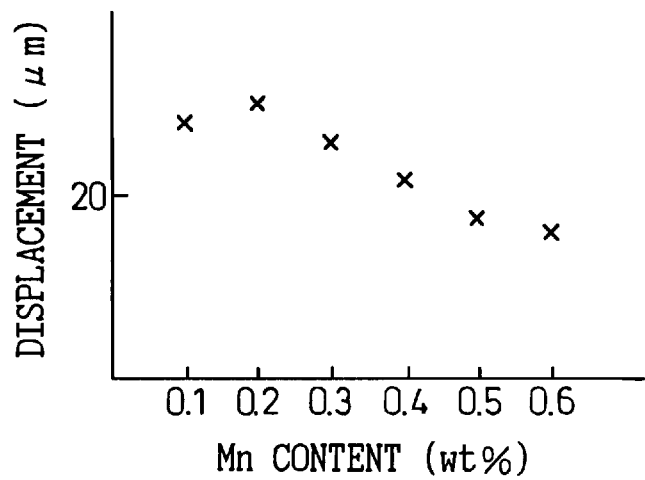
FIG. 15 is a view of the relation between an Mn content of a piezoelectric element and an amount of displacement upon driving according to an 11th embodiment of the present invention.

From FIG. 15, it is learned that the smaller the content of Mn, the larger the amount of displacement. That is, this suggests that it too much Mn is added, there is a possibility of it being difficult to obtain the large amount of displacement required.

From the above, since if the content of Mn is small, the effect of prevention of cracks is weak, while if the content is too large, the amount of displacement ends up falling, it is learned that Mn should be contained in an amount of 0.005 to 0.4 wt % with respect to the piezoelectric layers.

TABLE 7

| Mn content (wt %) | No. of shots generated | No. of cracks |
| --- | --- | --- |
| 0 | 1 | 3 |
| $5 \times 10^{-3}$ | 0 | 0 |
| $1 \times 10^{-2}$ | 0 | 0 |
| $1.5 \times 10^{-2}$ | 0 | 0 |

12th Embodiment

In this embodiment, the distribution of particle sizes of the piezoelectric layers, the amount of displacement, and the durability were measured.

Piezoelectric elements were prepared as samples by the same method as in the first embodiment, but the piezoelectric layers were given substantially the same particle sizes in consideration of particle growth after firing. Three piezoelectric elements comprised of piezoelectric layers of substantially the same particle sizes were each prepared.

The amounts of displacement of the piezoelectric elements were measured in the same way as in the 11th embodiment. Further, the particle sizes of the piezoelectric layers were measured as shown in FIG. 16.

That is, the piezoelectric elements were cut to expose cross-sections of the piezoelectric layers. Photographs were taken of the cross-sections enabling determination of the particle sizes of the sintered particles by a scan type microscope.

Here, a square α of 50 μm sides was provided and a line β, line γ, etc. were provided to pass through one side of the square α to the other side. A total of 10 such lines were provided at random.

Further, as shown in FIG. 16, the portions r1 to r9 etc. where the sintered particles were run through by the lines were measured, the average values of r1 to r9 etc. were calculated, and the results were used as the particle sizes.

Piezoelectric elements were prepared and driven under the same drive conditions as the first embodiment to investigate the situation of occurrence of short-circuits and cracks. The results are shown in Table 8.

Note that the cracks 63 occurring during the driving in the present embodiment occurred mostly near the ends 210 of the internal electrode layers 21 as shown in FIG. 7.

From Table 8, it is learned that the piezoelectric elements having a particle size of not more than 8 μm neither short-circuited or cracked.

With a particle size of 8.5 μm, the piezoelectric element could be driven $2 \times 10^6$ times, but cracks occurred. With a particle size of 9.2 μm, short-circuiting occurred before the piezoelectric element was driven $2 \times 10^6$ times.

From the above, it is learned that if the particle size is too large, cracks occur, so the particle size of the sintered particles of the piezoelectric layer is preferably not more than 8 μm.

Note that in the above embodiments, the explanation was given with reference to a rectangular sectional shape of the piezoelectric element, but the present invention is not limited to this. Similar effects can be obtained even if applying it to a piezoelectric element 1 having a barrel-shaped cross-section or round cross-section as shown in FIG. 17 or a hexagonal cross-section as shown in FIG. 18.

TABLE 8

| Particle size ($\mu$m) | No. of shots generated | No. of cracks |
|---|---|---|
| 6.8 | 0 | 0 |
| 7.6 | 0 | 0 |
| 8.0 | 0 | 0 |
| 8.5 | 0 | 3 |
| 9.2 | 3 | 3 |

While the invention has been described with reference to specific embodiment chosen for purpose of illustration, it should be apparent that numerous modifications could be made thereto by those skilled in the art without departing from the basic concept and scope of the invention.

The present disclosure relates to subject matter contained in Japanese Patent Applications No. 2000-163234, filed on May 31, 2000, and No. 2001-130168, filed on Apr. 26, 2001 the disclosures of which are expressly incorporated herein by reference in their entirety.

What is claimed is:

1. A piezoelectric element built into an injector for generating drive force for the injector, comprising:
   a plurality of alternately stacked piezoelectric layers expanding and contracting in accordance with an applied voltage and internal electrode layers for supplying the applied voltage;
   each piezoelectric layer containing voids;
   a total thickness, in a stacking direction, of voids contained in one piezoelectric layer being not more than 1/3 of a thickness of the piezoelectric layer in the stacking direction; and
   a thickness of any single void in the stacking direction being not more than 50 $\mu$m.

2. A piezoelectric element built into an injector as set forth in claim 1, wherein said piezoelectric element can drive the injector at least $2\times10^9$ times.

3. A piezoelectric element built into an injector for generating drive force for said injector, comprising:
   a plurality of alternately stacked piezoelectric layers expanding and contracting in accordance with an applied voltage and internal electrode layers for supplying the applied voltage;
   a relation of 70%$\leq$S2/S1$\leq$98% standing between an area S1of a stacking surface of said piezoelectric layer perpendicular to a stacking direction of piezoelectric layers and an area S2of an internal electrode layer covering said stacking surface.

4. A piezoelectric element built into an injector for generating drive force for the injector, comprising:
   a plurality of alternately stacked piezoelectric layers expanding and contracting in accordance with an applied voltage and internal electrode layers for supplying the applied voltage;
   each piezoelectric layer containing voids;
   a total thickness, in a stacking direction, of voids contained in one piezoelectric layer being not more than 1/3 of a thickness of the piezoelectric layer in the stacking direction;
   a thickness of any single void in the stacking direction being not more than 50 $\mu$m;
   a thickness of said internal electrode layer being not more than 0.11 times a thickness of said piezoelectric layer;
   a relation of 70%$\leq$S2/S1$\leq$98% standing between an area S1of a stacking surface of said piezoelectric layer perpendicular to a stacking direction of piezoelectric layers and an area S2of an internal electrode layer covering said stacking surface;
   the piezoelectric element being divided in the stacking direction of the piezoelectric layers into a drive part, buffer parts arranged so as to sandwich the drive part, and dummy parts arranged so as to sandwich the buffer parts;
   the drive part, buffer parts, and dummy parts being configured so that the amounts of expansion and contraction at the time of application of voltage becomes smaller in the order of the drive part, buffer parts, and dummy parts; and
   a thickness of a piezoelectric layer at the buffer parts being 1.1 to 5.0 times a thickness of a thinnest piezoelectric layer in said drive part.

5. A piezoelectric element built into an injector as set forth in claim 6, wherein the thickness of a piezoelectric layer in said drive part is not more than 280 $\mu$m.

6. A piezoelectric element built into an injector as set forth in claim 4, wherein a buffer part includes a plurality of piezoelectric layers.

7. A piezoelectric element built into an injector as set forth in claim 4, wherein a plurality of drive parts and buffer parts are alternately arranged.

8. A piezoelectric element built into an injector as set forth in claim 4, wherein a thickness of a piezoelectric layer in a dummy part is not less than 3 times a thickness of a thinnest piezoelectric layer in said drive part.

9. A piezoelectric element built into an injector as set forth in claim 4, wherein said internal electrode layer is comprised of a material containing Ag and Pd.

10. A piezoelectric element built into an injector as set forth in claim 3, wherein
   said internal electrode layer is comprised of a material containing Ag and Pd; and
   said Ag—Pd containing material contains at least 10 wt % of Pd with respect to the total weight of Ag and Pd.

11. A piezoelectric element built into an injector as set forth in claim 4, wherein
   said internal electrode layer is comprised of a material containing Ag and Pd;
   said Ag—Pd containing material contains at least 10 wt % of Pd with respect to the total weight of Ag and Pd; and
   sintered particles comprising the Ag—Pd containing material include at least 80% of particles of a particle size of not more than 10 $\mu$m.

12. A piezoelectric element built into an injector as set forth in claim 4, wherein each piezoelectric layer is mainly comprised of lead zirconium titanate.

13. A piezoelectric element built into an injector as set forth in claim 4, wherein
   each said piezoelectric element is mainly comprised of lead zirconium titanate; and
   each said piezoelectric layer contains Mn, the content of Mn being 0.005 to 0.4 wt % with respect to the piezoelectric layer.

14. A piezoelectric element for an injector as set forth in claim 6, wherein each said piezoelectric element is mainly comprised of lead zirconium titanate;

each said piezoelectric layer contains Mn, the content of Mn being 0.005 to 0.4 wt % with respect to the piezoelectric layer;

said lead zirconium titanate basically comprising a $Pb(Y_{0.5}Nb_{0.5})O_3$—$PbTiO_3$—$PbZrO_3$—based solid solution;

ratios of ingredients in said three-ingredient solid solution are 0.5 mol %<$Pb(Y_{0.5} Nb_{0.5})O_3 \leqq$3mol %, 42 mol %<$PbTiO$,<50 mol %, and 47 mol %<$PbZrO_3 \leqq$57.5 mol %;

substituent groups of Pb by sr are present in more than 5 mol % and not more than 15 mol %;

a content of $Nb_2O_5$ to lead zirconium titanate is not more than 1 wt %; and a content of $Mn_2O_3$ to lead zirconium titanate is not less than 0.01 wt % and less than 0.5 wt %.

15. A piezoelectric element built into an injector as set forth in claim 4, wherein sintered particles comprising the piezoelectric layer have a particle size of not more than 8 μm.

16. A piezoelectric element built into an injector as set forth in claim 4, which drives the injector a plurality of times for each combustion stroke of an internal combustion engine.

* * * * *

UNITED STATES PATENT AND TRADEMARK OFFICE
CERTIFICATE OF CORRECTION

PATENT NO.     : 6,483,227 B2
DATED          : November 19, 2002
INVENTOR(S)    : Murai et al.

It is certified that error appears in the above-identified patent and that said Letters Patent is hereby corrected as shown below:

<u>Title page,</u>
Item [30], Foreign Application Priority Data, change the following information:
"April 26, 2001    (JP)        2000-130168" to
-- April 26, 2001  (JP)        2001-130168 --.

Signed and Sealed this

Tenth Day of June, 2003

JAMES E. ROGAN
*Director of the United States Patent and Trademark Office*